(12) United States Patent
Garber

(10) Patent No.: US 11,306,876 B2
(45) Date of Patent: *Apr. 19, 2022

(54) MINIATURE INTEGRATED OMNIDIRECTIONAL LED BULB

(71) Applicant: EmeryAllen, LLC, Mt. Pleasant, SC (US)

(72) Inventor: Thomas Garber, Daniel Island, SC (US)

(73) Assignee: EmeryAllen, LLC, Mount Pleasant, SC (US)

(*) Notice: Subject to any disclaimer, the term of this patent is extended or adjusted under 35 U.S.C. 154(b) by 163 days.

This patent is subject to a terminal disclaimer.

(21) Appl. No.: 16/836,340

(22) Filed: Mar. 31, 2020

(65) Prior Publication Data

US 2020/0224828 A1 Jul. 16, 2020

Related U.S. Application Data

(63) Continuation-in-part of application No. 16/194,083, filed on Nov. 16, 2018, now Pat. No. 10,605,412.

(51) Int. Cl.
| | |
|---|---|
| *F21K 9/232* | (2016.01) |
| *F21V 29/70* | (2015.01) |
| *F21K 9/66* | (2016.01) |
| *F21K 9/238* | (2016.01) |
| *F21V 29/85* | (2015.01) |
| *F21Y 115/10* | (2016.01) |

(52) U.S. Cl.
CPC ............ *F21K 9/232* (2016.08); *F21K 9/238* (2016.08); *F21K 9/66* (2016.08); *F21V 29/70* (2015.01); *F21V 29/86* (2015.01); *F21Y 2115/10* (2016.08)

(58) Field of Classification Search
CPC ........ F21V 23/005; F21K 9/238; F21K 9/232; F21K 9/66
See application file for complete search history.

(56) References Cited

U.S. PATENT DOCUMENTS

| 6,580,228 B1 * | 6/2003 | Chen .................. F21K 9/90 315/185 R |
| 10,107,487 B2 * | 10/2018 | Brandes ................ F21V 29/70 |
| 2008/0062703 A1 * | 3/2008 | Cao .................. F21K 9/232 362/311.06 |

(Continued)

*Primary Examiner* — Julie A Bannan
(74) *Attorney, Agent, or Firm* — Gregory Finch; Finch Paolino, LLC

(57) ABSTRACT

The present disclosure relates to various embodiments to enable the assembly, construction, and operation of a miniature integrated LED lamp comprising an envelope positioned at a distal end of a solid body portion and a base positioned at a proximal end of the solid body. The envelope further comprises a transparent light diffuser enclosing a semi-cylindrical light pipe containing one or more LEDs populated on its external surface and a LED driver positioned internally within a formed lumen of the light pipe. The light pipe and LED driver are physically and or electrically connected to a cylindrical heatsink encapsulated within the envelope and body portion of the bulb, facilitating thermal management. The envelope and base are assembled together with one or more specific lamp bases to form an LED lamp satisfying performance standards suitable for retrofit or replacement of a standard INC or halogen lamp.

20 Claims, 9 Drawing Sheets

(56) References Cited

U.S. PATENT DOCUMENTS

| | | | | |
|---|---|---|---|---|
| 2010/0096643 | A1* | 4/2010 | Cao | F21K 9/232 |
| | | | | 257/88 |
| 2012/0126699 | A1* | 5/2012 | Zittel | H05B 45/30 |
| | | | | 315/86 |
| 2012/0291269 | A1* | 11/2012 | Fiene | H05B 45/375 |
| | | | | 29/825 |
| 2013/0301252 | A1* | 11/2013 | Hussell | F21V 29/60 |
| | | | | 362/184 |
| 2014/0265835 | A1* | 9/2014 | Canter | H05B 45/3725 |
| | | | | 315/53 |
| 2014/0268819 | A1* | 9/2014 | Negley | F21K 9/90 |
| | | | | 362/351 |
| 2019/0072238 | A1* | 3/2019 | Li | F21K 9/237 |

\* cited by examiner

MINIATURE INTEGRATED OMNIDIRECTIONAL LED BULB

CROSS-REFERENCE TO RELATED APPLICATIONS

This application is a continuation-in-part of U.S. patent application Ser. No. 16/194,083 filed Nov. 16, 2018 and titled "MINIATURE INTEGRATED OMNIDIRECTIONAL LED BULB," the disclosure of which is incorporated by reference herein in its entirety.

FIELD

The present disclosure relates to the field of solid-state lighting (SSL) devices; in particular, to a miniature lighting device and methods incorporating light emitting diodes (LEDs) for replacement of standard 120-277 v incandescent bulbs and low voltage (6-24 v) halogen lamps.

BACKGROUND

Light emitting diodes (LED or LEDs) are solid state devices that convert electric energy to light, and generally comprise one or more active layers of semiconductor material sandwiched between opposed doped layers. When a diode is forward biased (switched on), electrons can recombine with holes within the device, releasing energy in the form of photons. This effect is called electroluminescence and the color of the light (corresponding to the energy of the photon) is determined by the energy gap of the semiconductor. LEDs are monochromatic light sources and the production of white light requires the use of color mixing such as blue LED produced by Gallium Nitride combined with a phosphor layer. White light is produced from the absorption of blue light and re-mission into yellow light by phosphor, as well as the subsequent mixing of yellow and blue light.

Incandescent (INC) omnidirectional lamps are the most common lighting sources in use today. Incandescent lamps produce light through the process of incandescence, whereby electricity passing through a tungsten filament causes it to heat up and produce visible light. Over time the filament material can evaporate and deposit onto the inner surface of the glass bulb. Halogen lamps have overcome this problem by using halogen elements in combination with evaporated tungsten and depositing back onto the filament, allowing a smaller form factor than traditional INC lamps. Halogen lamps produce a large amount heat with most of the radiation produced in the infrared region. LED technologies or Solid-State Lighting (SSL) present significant advantages compared to these alternative lighting solutions in respect of their operating principle, electrical efficiency, economical value, and environmental impact. In many applications, several LED dies or chips are mounted within an LED package or on an LED module, which may make up part of a lighting unit, lamp, or bulb. An LED bulb may be made with a form factor that allows it to replace a standard threaded incandescent bulb or any of various types of fluorescent lamps, achieving similar performance using a fraction of the power.

Consumer satisfaction is an important factor affecting the rate and scope of any lighting solutions market transformation. This is evident through the collective experience with compact fluorescent lamps (CFLs) where public perceptions were severely tainted by early customer experiences with poor quality products based on performances such as color, flicker, noise, lack of intensity control, and early failure. The introduction of LED lighting products into the consumer market has produced both high and low-quality lamps. Some can replace incandescent lamps with little or no noticeable difference, while others fall short on certain performance attributes and thus do not make suitable replacement products. Manufacturers have reportedly used the highest quality LEDs for photometric testing, only to use lower quality LEDs for bulk manufacture [Southern California Edison. (August 2009). LED MR16 Lighting. ET 07.14 Report]. Most of the currently available replacement lamps in the market produce significantly poor color rendering compared to incandescent lamps.

The importance of reducing energy use for both environmental and economic reasons is apparent to everyone. Under the assumption of a large commercial acceptance rate, LED "bulbs" have the potential to cut lighting loads in the United States by nearly one half by 2030 (Department of Energy, 2012). There is widespread recognition that only high-quality products will deliver the market acceptance required for broad adoption of LED lighting solutions. Residential consumers are accustomed to high CRI sources, as incandescent lamps (with 100 CRI) are the predominant lamps in the residential sector. CRI is a measure of how accurately a light source renders the colors of the objects being illuminated, compared to a reference light source of the same color temperature. Therefore, the goal of many SSL programs is aimed at accelerating development, demonstrating technologies, and formulating performance standards, regulations, labeling, and certifications. Industry bodies for LED Standardization in the US include Professional Associations, Standards Organizations, Trade Organizations, Government Agencies: Illumination Engineering Society of North America (IESNA), Institute of Electrical and Electronic Engineers (IEEE); Underwriters Laboratories (UL), American National Standards Institute (ANSI); National Electrical Manufacturers Association (NEMA); Department of Energy (DOE), Environmental Protection Agency (EPA), Energy Star Program; U.S. Standard Organizations; Organizations developing LED Lighting Safety Standards; U.S. Government Regulations and LED Programs; Federal and local government regulatory positions. From an industry perspective, standards and regulations provide a platform for consistent language of definitions, test methods, laboratory accreditation and for product design, manufacturing and testing. From a governmental perspective, regulation helps ensure public safety, provides consumer protection, regulates energy consumption and monitors environmental issues.

Federal and State (local) government regulations have established standards, voluntary and mandatory, for SSL products, and provide incentives such as financial investment, loans, and grants, to encourage development and deployment of SSL products meeting such standards to replace or retrofit conventional lighting products. For example, the State of California has established the 2016 Building Energy Efficiency Standards (effective Jan. 1, 2017) representing a major step towards meeting California's residential Zero Net Energy (ZNE) goal by the year 2020. California has had a long history of energy efficiency leadership including state appliance standards since 1976 (Title 20), building energy efficiency standards since 1978 (Title 24, part 6) and mandatory and voluntary green building standards since 2008 (CalGreen or Title 24, part 11). State energy policy calls for all new homes to be Zero Net Energy (ZNE) by 2020, and all new commercial buildings to be ZNE by 2030. All residential buildings that are regulated occupancies must be designed and built to comply with the mandatory measures of Title 20 (certification of individual products) and Title 24 (building code requiring JA8 certification of light sources). Reference Joint Appendix JA8 regulations now set quality standards for certain types of high efficacy lamps and luminaires installed in residences, regardless of source type. Title 20 standard aims to ensure a minimum level of LED replacement lamp quality to build and maintain consumer satisfaction with LED lamps. To do this, the standard aims to set requirements that result in LED lamps with performance characteristics that are virtually indistinguishable from those of the incandescent lamps they are designed to replace. For compliance, products must conform to many requirements, including, but not limited to, lumen output, efficacy, color quality, color consistency, power factor, light distribution, power spectral distribution, lamp flicker, dimming performance, and lumen maintenance (hrs) lifetime.

As a lamp ages, for various reasons it produces less light but continues to consume the same amount of power. Lumen depreciation for LED packages is affected by operating conditions and varies substantially between different products. Temperature has a significant effect on the deterioration of LEDs, with most of the input energy being converted into heat (US DOE, 2007. Thermal Management of white LEDs), whereby higher temperatures result in higher levels of degradation. The ability of an LED replacement lamp to manage heat affects its performance, lumen output, CCT, longevity (lumen maintenance), and safety. LED is a semiconductor device that has a low melting temperature and therefore requires heat transfer to keep the junction temperature below a certain temperature limit (typically 125° C.). Thermal management techniques include the use of active and predominantly passive heatsinks employing fins to increase the surface area for heat dissipation to remove heat from the LED junction. Mass has been considered as an indicator of lamp quality, whereby a larger quantity of fin materials translates into more effective heatsinks and ultimately smaller changes in luminous flux over time. However, the design of LED retrofit lamps or bulbs is constrained by the form factors of INC or halogen lamps (e.g., MR16), stipulated by standards, for example, ANSI 78.24, to fit within standard luminaires. The lack of space for accommodating a large heatsink in an E26 light bulb is a major constraint for LED product design. The form factor of most LED lamps has evolved, becoming lighter and smaller, in part due to increasing efficacy, which in turn results in less mass and/or volume needed for thermal management. LEDs require a power supply (commonly called a "driver") or LED ballast. The power supply converts line (AC) power to the appropriate DC voltage (typically between 2- and 4-volts DC for high-brightness LEDs) and current (generally 200-1000 milliamps, mA), and may also include supplementary electronics for dimming and/or color correction control. Innovative lamp manufacturers employ several solutions for thermal management, including improved drivers, reducing power losses of components, forced convection methods, improved heat sink designs, and advanced materials. However, it has been a challenge for manufacturers to meet standards, especially lumen maintenance lifetime for miniature LED lamps or packages under form factor constraints for retrofitting or replacement of various standard INC, halogen lamps, and luminaires.

Through applied effort, ingenuity, and innovation, Applicant has identified deficiencies and problems with existing integrated and retrofit LED packages, lamps, or bulbs to meet existing standards. Applicant has developed a solution that is embodied by the present invention, which is described in detail below.

SUMMARY

The following presents a simplified summary of some embodiments of the invention to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

An object of the present invention is an integrated miniature LED lamp ("bulb") comprising an envelope portion and a base portion. The envelope portion comprises an LED light assembly, a substantially cylindrical transparent light diffuser ("diffuser"), defining a lumen with a proximal open entrance and a solid transparent closed distal end, a cylindrical hollow heatsink ("heatsink") with open proximal and distal areas, and a solid non-transparent cylindrical body, defining a lumen with a distal open area, the solid non-transparent cylindrical body physically connected to the base portion. The base portion comprises a base and one or more alternative plugs for insertion into a socket of an external power source. The LED light assembly comprises one or more electrically and thermally connected LED, at least one LED driver, electrically connected to power one or more LEDs, whereby one or more LED, LED array, and LED driver are positioned and arranged on, one or more surface area portion, of a multilayer flexible printed circuit board (FPCB), electrically and or thermally connected through one or more surface conductive tracks of said FPCB. In various embodiments, the FPCB substrate, populated with one or more LED and LED driver ("driver"), shaped with one or more surface area portion, is folded at one or more plane axis, to form a semi-cylindrical light pipe ("light pipe"), preferably folded to encapsulate the LED driver internal to a formed lumen of the light pipe, enabling unobstructed light emission of one or more LED from one or more surfaces of the light pipe. The driver comprises one or more drive unit, circuit element, circuitry, topology, hardware components (e.g., resistor, diode, capacitor, IC, etc.), the components electrically connected to the plug of the base for connection to an external power source. In a preferred embodiment, one or more base portion is assembled to the distal end of the solid body portion of the envelope, a proximal portion of the heatsink is positioned within the lumen of the solid body portion at the distal end, a partial proximal portion of the light pipe is positioned within the lumen of the distal portion of the heatsink, a substantial distal length of the light pipe is positioned within the lumen of the diffuser by insertion through the proximal area opening and encapsulated within, the proximal and distal portions of the solid body portion and the diffuser are joined and sealed to encapsulate one or more LED, driver LED, light pipe, light assembly, and heatsink within the LED bulb. In a preferred embodiment, the assembly enables the light radiation or emission from the light pipe to pass through a substantial portion of the surface areas or volume of the diffuser. In a preferred embodiment, the proximal and distal portions of the light pipe, heatsink, and solid body portion of the envelope are physically connected for thermal conduction. In various embodiments the said bulb is configured and assembled, with one or more form factor, to function as a miniature integrated LED substantially visible light producing device with one or more advantageous functional characteristics relative to one or more form factor dimensions, volume, size, or shape. In a preferred embodiment, the bulb operates as an omnidirectional light source having a spectral distribution over the visible wavelength from greater than 400 nm and less than 800 nm, with a wavelength dependent power spectral density ranging from greater than 0 mW/nm to less than 12 mW/nm, over said range of wavelength. In various embodiments, the bulb input power is between 1 W to 10 W, preferably 1.5 W to 5 W, most preferably less than or equal to 5 W.

An object of the present disclosure is an LED bulb having advantageous functional characteristics capable of meeting one more performance standard, criteria, compliance score, or the like. In various embodiments, the bulb emits a relatively high luminous output and luminous efficacy. In various embodiments, the bulb comprises one or more form factor capable of producing one or more lumen outputs (lm), preferably at least 300 lm, more preferably between 400 lm-1000 lm, most preferably between 450 lm to 550 lm. In various embodiments, the bulb provides preferably greater or equal to 5% of lumens in the 110 to 180-degree zone, similarly in the 130 to 180-degree zone, more preferably greater than 20% of lumens in the 110 to 180-degree zone. In various embodiments, the bulb comprises one or more form factor enabling high luminous efficacy, preferably at least 72 lm per Watt, more preferably between 90 lm to 120 lm per Watt, most preferably between 95 lm to 110 lm per Watt. In various embodiments, the bulb produces a relatively high Color Rendering Index (CRI) and value at one or more Correlated Color Temperature (CCT). In various embodiments, the bulb comprises one or more form factor capable of producing one more CRI, preferably at least 60, more preferably between 80 and 100, most preferably greater than 90. In various embodiments, the bulb comprises one or more form factor enabling compliance with one or more wattage requirements of one or more lamp bases, including but not limited to medium screw base, intermediate, and candelabra.

An object of the present disclosure is a bulb comprising one or more form factor enabling compliance with one or more lumen maintenance, rated life, and survival rate criteria. In various embodiments, one or more form factor enables said bulb to have a projected L70 of at least 25,000 hours (hrs), a minimum rated lifetime of 15,000 hrs, and at least 90% of more than one bulb units tested are operational at the completion of one or more 1500, 2000, 3000, 5000, or 6000 hrs life tests. In a preferred embodiment, the one or more form factor enables said bulb to have a minimum rate lifetime of 50,000 hrs.

An object of the present disclosure is a bulb comprising one or more form factor enabling compliance with one or more operation standards or criteria, including but not limited to zonal distribution, start time, power factor, amplitude modulation, dimming requirement, flicker, noise emission, or the like. In various embodiments, said bulb produces greater or equal to 5% of lumens in the 110 to 180 degree zone, preferably for use in but not limited to ANSI standard B, BA, CA, F, or G-Shape Lamps. In various embodiments, said bulb preferably has a start time of less than or equal to 500 milliseconds, more preferably less than 100 milliseconds, most preferably less than 10 milliseconds. In various embodiments, said bulb has a power factor preferably greater than or equal to 0.7, and most preferably greater than or equal to 0.9. In various embodiments, said bulb is dimmable, preferable dimmable to less than or equal to 10% of full light output, and most preferably less than or equal to 1%. In various embodiments, said bulb operates with reduced flicker, preferably light output modulation less than or equal to 30% for frequencies less than 200 Hz. In various embodiments, during operation said bulb produces less than or equal to 24 bBA of audible emission at 100% and 20% of full light output.

An object of the present disclosure is a bulb having one or more form factor, dimension, size, shape, or volume, incorporating a variety of bases, to duplicate, replace, or retrofit one or more standard INC or halogen light source, lamp, bulb, or the like. In various embodiments, the said bulb is a stand-alone integrated LED lamp for use in one or more outdoor, indoor applications, stadium, venue, transportation vehicle (e.g., automobile, bus, motorcycle, airplane, etc.) in any luminaire, light fixture, and appliance, including but not limited to bath lights, pendants, ceiling fans, portable lamp, chandeliers, cabinet, house fix, flush mount, wall sconces, or the like.

Certain aspects of the present disclosure provide for a miniature light emitting diode (LED) light bulb comprising a base portion including one or more electrical contacts arranged to mate with an electrical receptacle to receive electric current; an envelope portion comprising a substantially cylindrical body portion coupled to the base portion; a heat sink coupled to an inner circumference of the body portion, the heat sink comprising a ceramic substrate being housed in a metal tube; and a substantially cylindrical light diffusing portion coupled to an upper circumference of the body portion, the light diffusing portion and the body portion defining an interior portion of the envelope portion, the envelope portion being less than 75 mm in length and less than 25 mm in diameter; and an LED light assembly being housed in the interior portion of the envelope portion, the LED light assembly comprising a flexible printed circuit board; a plurality of LEDs being disposed on a surface of the flexible printed circuit board, the plurality of LEDs being electrically and thermally connected to comprise an LED array; and an electronics assembly being disposed on a surface of the flexible printed circuit board and comprising an LED driver and an integrated circuit being operably engaged with the one or more electrical contacts and the plurality of LEDs to provide power to the LED array, wherein the LED array and the electronics assembly are operably configured to comprise a luminous efficiency of at least 45 lumens per watt, wherein the flexible printed circuit board is folded at one or more plane axis to define a radial arrangement of the plurality of LEDs.

Certain aspects of the present disclosure provide for a miniature light emitting diode (LED) light bulb comprising a base portion including one or more electrical contacts arranged to mate with an electrical receptacle to receive electric current; an envelope portion comprising a substantially cylindrical body portion coupled to the base portion; a heat sink coupled to an inner circumference of the body portion; and a substantially cylindrical light diffusing portion coupled to an upper circumference of the body portion, the light diffusing portion and the body portion defining an interior portion of the envelope portion, the envelope portion being less than 75 mm in length and less than 25 mm in diameter; and, an LED light assembly being housed in the interior portion of the envelope portion, the LED light assembly comprising a flexible printed circuit board being less than or equal to 95 millimeters in length and less than or equal to 30 millimeters in width when in a planar configuration; a plurality of LEDs disposed on a surface of the flexible printed circuit board, the plurality of LEDs being electrically and thermally connected to comprise an LED array; and an electronics assembly disposed on a surface of the flexible printed circuit board, the electronics assembly comprising an LED driver and an integrated circuit being operably engaged with one or more electrical contacts to receive electricity and operably engaged with the plurality of LEDs to provide power to the LED array, the LED array and the electronics assembly being operably configured to comprise a luminous efficiency of at least 45 lumens per watt, wherein the flexible printed circuit board is folded at one or more plane axis to define a radial arrangement of the LED array.

Further aspects of the present disclosure provide for a miniature light emitting diode (LED) light bulb comprising a base portion including one or more electrical contacts arranged to mate with an electrical receptacle to receive electric current; an envelope portion comprising a substantially cylindrical body portion coupled to the base portion; a heat sink coupled to an inner circumference of the body portion, the heat sink comprising a ceramic substrate being housed in a metal tube; and a substantially cylindrical light diffusing portion coupled to an upper circumference of the body portion, wherein the base portion and the envelope portion together are less than 100 mm in length and less than 25 mm in diameter; and an LED light assembly being housed in the interior portion of the envelope portion, the LED light assembly comprising a flexible printed circuit board; a plurality of LEDs being disposed on a surface of the flexible printed circuit board, the plurality of LEDs being electrically and thermally connected to comprise an LED array; and an electronics assembly being disposed on a surface of the flexible printed circuit board and comprising an LED driver and an integrated circuit being operably engaged with the one or more electrical contacts and the plurality of LEDs to provide power to the LED array, wherein the LED array and the electronics assembly are operably configured to comprise a luminous efficiency of at least 45 lumens per watt, wherein the flexible printed circuit board is folded at one or more plane axis to define a radial arrangement of the plurality of LEDs.

The foregoing has outlined rather broadly the more pertinent and important features of the present invention so that the detailed description of the invention that follows may be better understood and so that the present contribution to the art can be more fully appreciated. Additional features of the invention will be described hereinafter which form the subject of the claims of the invention. It should be appreciated by those skilled in the art that the conception and the disclosed specific methods and structures may be readily utilized as a basis for modifying or designing other structures for carrying out the same purposes of the present invention. It should be realized by those skilled in the art that such equivalent structures do not depart from the spirit and scope of the invention as set forth in the appended claims.

BRIEF DESCRIPTION OF DRAWINGS

The above and other objects, features and advantages of the present disclosure will be more apparent from the following detailed description taken in conjunction with the accompanying drawings, in which.

DETAILED DESCRIPTION

Figure 1:
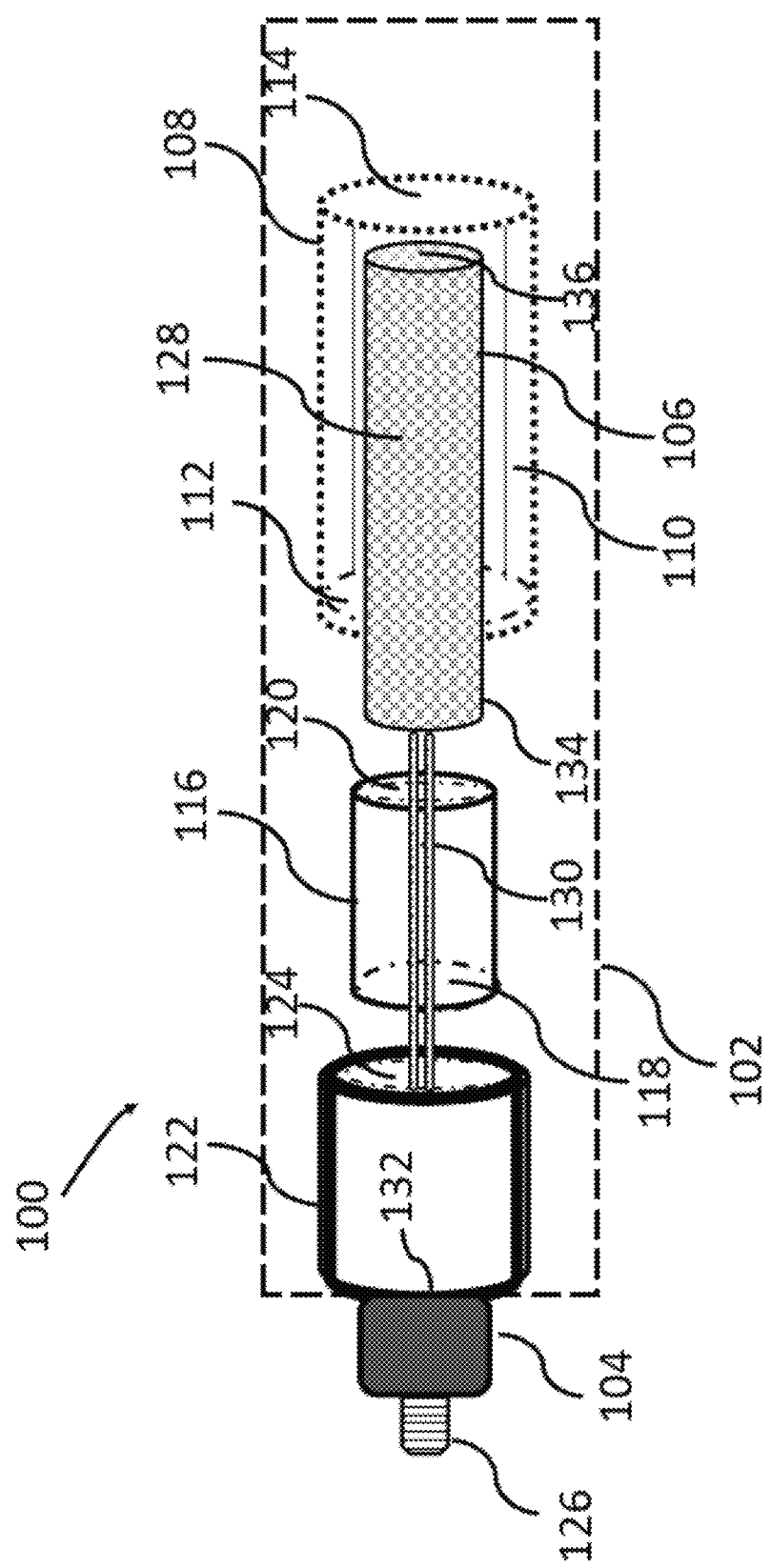
FIG. 1 is a schematic view of a miniature LED bulb and the components of the visible light producing device, according to an embodiment of the present disclosure.

Exemplary embodiments are described herein to provide a detailed description of the present disclosure. Variations of these embodiments will be apparent to those of skill in the art. Moreover, certain terminology is used in the following description for convenience only and is not limiting. For example, the words "right," "left," "top," "bottom," "upper," "lower," "inner" and "outer" designate directions in the drawings to which reference is made. The word "a" is defined to mean "at least one." The terminology includes the words above specifically mentioned, derivatives thereof, and words of similar import.

The present disclosure relates to various embodiments to enable the assembly, construction, and operation of a miniature integrated LED lamp ("bulb") comprising an envelope positioned at a distal end of a solid body portion and a base positioned at a proximal end of the solid body. The envelope further comprises a transparent light diffuser enclosing a semi-cylindrical light pipe containing one or more LEDs populated on its external surface and a LED driver positioned internally within a formed lumen of the light pipe. The light pipe and LED driver are physically and/or electrically connected to a cylindrical heatsink encapsulated within the envelope and body portion of the bulb, facilitating thermal management. The envelope and base are assembled together with one or more specific lamp bases to form an LED lamp satisfying performance standards suitable for retrofit or replacement of a standard INC or halogen lamp. The bulb operates as an omnidirectional SSL source with a spectral distribution over visible wavelength from greater than 400 nm to less than 800 nm, a wavelength dependent power spectral density ranging from greater than 0 mW/nm to less than 12 mW/nm, and input power between 1 W to 10 W. The bulb comprises one or more design form factors and methods operation that translate into functional characteristics capable of complying with one or more industry and government performance standard, criteria, or compliance score. Exemplary standards include: CEC TITLE 20—Division 2—Chapter 4—Appliance Efficiency Regulation; CEC-400-2015-038-CMF Appendix JA8—Qualification Requirements for High Efficacy Light Sources; CEC-400-2015-038-CMF Appendix JA10—Test Method for Measuring Flicker of Lighting Systems; IESNA LM-79—2008: Electrical and Photometric Measurements of Solid State Lighting; ANSI NEMA ANSLG C78.377: 2015: Specifications of the Chromaticity of Solid State Lighting Products; UL 1993-2017: Standard for Safety—Self-Ballasted Lamps and Lamp Adapters Lamps.

Referring to FIG. 1, a schematic view of a miniature LED bulb 100 and the components of the visible light producing device according to various embodiments is shown. The integrated miniature LED lamp ("bulb") comprises an envelope portion 102 and a base 104. The envelope portion comprises an LED light assembly 106, shaped as a semi-cylindrical light pipe, a substantially cylindrical transparent light diffuser 108, defining a lumen 110 with a proximal open entrance 112 and a transparent solid closed distal end 114, a cylindrical substantially hollow heatsink 116 with an open proximal area 118 and distal open area 120, and a solid non-transparent cylindrical body 122, defining a lumen with a distal open area 124, the solid non-transparent cylindrical body 122 positioned adjacent to the base 104. The base comprises one or more alternative designs, with one or more alternative plug 126 for insertion into a socket of an external power source. The LED light assembly 106 comprises one or more electrically and thermally connected LED 128, at least one LED driver (not shown), electrically connected via electrical connection(s) 130 to one or more plug 126 of the base 104. In a preferred embodiment, one or more base 104 is assembled to the proximal end portion 132 of the solid body of the envelope, a proximal portion 118 of the heatsink 116 is positioned within the lumen of the solid body portion at the distal end 124, a partial proximal portion 134 of the light pipe is positioned within the lumen of the distal portion 120 of the heatsink 116, a substantial length extending to distal end 136 of the light pipe positioned within the lumen 110 of the diffuser 108 by insertion through the proximal area opening 112 and encapsulated within, the proximal 112 and distal 124 portions of the solid body 122 and the diffuser 108 are joined and sealed to encapsulate one or more LED 128, light assembly 106, LED driver, light pipe, and heatsink 116 within the LED bulb. In a preferred embodiment, the proximal area 118 outer diameter of heatsink 116 is substantially equal to and preferably less than the inner diameter of the inner distal area 124 diameter of solid body 122. In a preferred embodiment, the proximal area 134 outer diameter of light assembly 106 is substantially equal to and preferably less than the inner diameter of the inner distal area 120 diameter of heatsink 116. Heatsink 116 may be constructed of a metal tube and a ceramic substrate. In certain embodiments, the outer diameter of heatsink 116 may comprise a metal tube structure (e.g., aluminum) wherein a ceramic substrate is disposed on and/or extending between the inner diameter of the metal tube. In a preferred embodiment, the proximal area 134 outer diameter of solid body 122 is substantially equal to the outer diameter of proximal area 112 of diffuser 108. In various embodiments, 15% to 50% of the length of heatsink 116 is positioned within the lumen of solid body 122. In various embodiments, 1% to 10% of the length of light assembly 106 is positioned within the lumen of heatsink 116. In various embodiments, the one or more components are connected by physical press fit, or by one or more sealant, or glue, at one or more physical junction. In an alternative embodiment, the solid body portion 132 and base 104 are fabricated as a single component via injection molded manufacturing. In various embodiments, base 104 may comprise one or more dimension or shape compatible with one or more base type and plug, complying with one or more standards for making electrical connections for retro-fitting or replacing conventional INC lamp or halogen lamp. In a preferred embodiment, the assembly enables the light radiation or emission from the light pipe to pass through a substantial portion of the surface areas, longitudinal or perpendicular to its central axis, or volume of the diffuser. In various embodiments, the diffuser may comprise a material having a high visible spectrum transmittance, preferably 80%, more preferably at least about 85%, more preferably at least about 90%, more preferably at least about 95%, more preferably at least about 97% of at least one wavelength in the visible range together with high thermal conductivity. Exemplary materials include, but are not limited to, sintered silicon carbide, crystalline silicon carbide, high thermal conductivity glass (e.g., comprising indium tin oxide), or high transmittance or high thermal conductivity plastic. In a preferred embodiment, the proximal and distal portions of the light pipe, heatsink, and solid body portion of the envelope are in physical contact or physically connected for thermal conduction. In various embodiments the said bulb is configured and assembled, with one or more form factor, to function as a miniature integrated LED substantially visible light producing device with one or more advantageous functional characteristics relative to one or more form factor dimensions, volume, size, or shape. In one embodiment, the diameter of the miniature bulb is between 15 millimeters to 20 millimeters and the length of the envelope is approximately 25 millimeters long. In a preferred embodiment, the bulb operates as an omnidirectional light source having a spectral distribution over the visible wavelength from greater than 400 nm to less than 800 nm, with a wavelength dependent power spectral density ranging from greater than 0 mW/nm to less than 12 mW/nm, over said range of wavelength. In various embodiments, the bulb input power is between 1 W to 10 W, preferably 1.5 W to 5 W, and most preferably less than or equal to 5 W.

Figure 2:
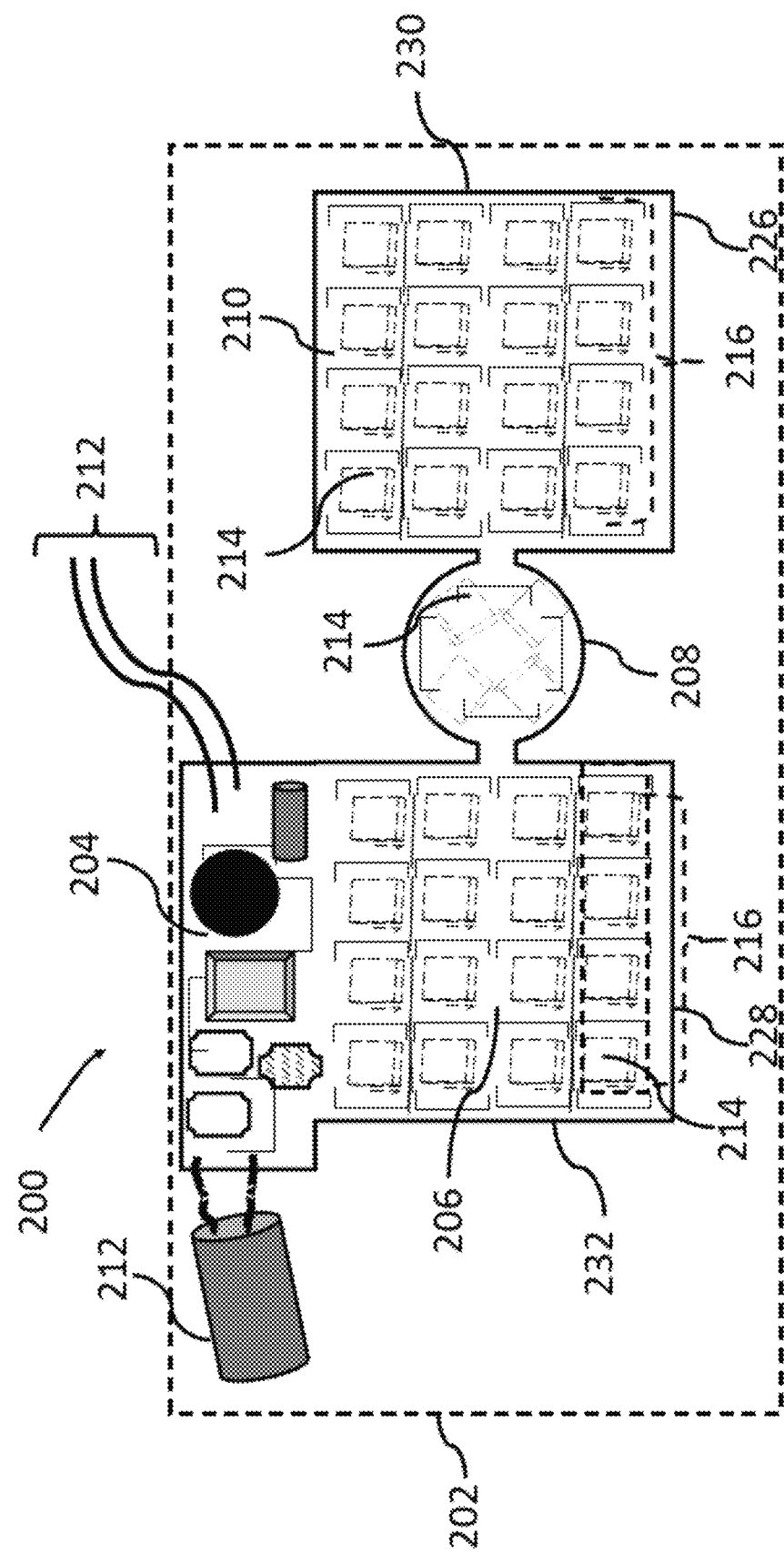
FIG. 2 is a schematic diagram of an LED lighting array in a planar configuration, according to an embodiment of the present disclosure.

Referring to FIG. 2, an illustration of the light pipe unfolded is shown according to various embodiments. Light pipe 202 comprises a multilayer flexible printed circuit board (FPCB) 200 shaped with more characteristic surface area portions connected contiguously. In various embodiments, said FPCB 200 comprises a rectangular area portion 204, positioned adjacent to a square area portion 206, a semi-circular area portion 208, and a second square surface area portion 210. According to an embodiment, the overall length of FPCB 200 is in the range of about 60 mm to about 80 mm; the dimensions of rectangular area portion 204 may be in the range of about 25 mm to about 35 mm in length and about 5 mm to about 15 mm in width; the dimensions of square area portion 206 may be in the range of about 20 mm to about 30 mm in length and about 20 mm to about 30 mm in width; the dimensions of semi-circular area portion 208 may be in the range of about 10 mm to about 20 mm in diameter; and the dimensions of second square surface area portion 210 may be in the range of about 20 mm to about 30 mm in length and about 20 mm to about 30 mm in width. In certain embodiments, FPCB 200 is less than or equal to 95 millimeters in length and less than or equal to 30 millimeters in width when in a planar configuration. In various embodiments, the one or more surface area portions are populated with one or more elements of the LED light producing assembly. In a preferred embodiment, area portion 204 is populated with one or more circuit element, circuitry, topology, hardware components ("driver elements") of an LED driver for controlling the operation of light pipe 202. For example, one or more circuit component may be, but is not limited to, a capacitor 212 of a LED driver or electrical contacts 214 for connection to a base plug (not shown) enabling the light pipe to be powered by an external power source. In various embodiments, the one or more surface area portions are populated by one or more LED or LED array whereby at least one LED is electrically and thermally connected to another LED, positioned in one or more distance relative to each other. In a preferred embodiment, the square surface area portion 206, semi-circular area portion 208, and square surface area portion 210, are populated with one or more LED 214, one or more said LED may be connected to form an LED array 216. The one or more LED 214, or LED array 216 may be electrically or thermally connected to one or more LED driver elements via one or more conductive tracing or contacts, printed on one or more top, bottom, or internal surfaces (e.g., bore, hole, etc.) of said FPCB.

Figure 3:
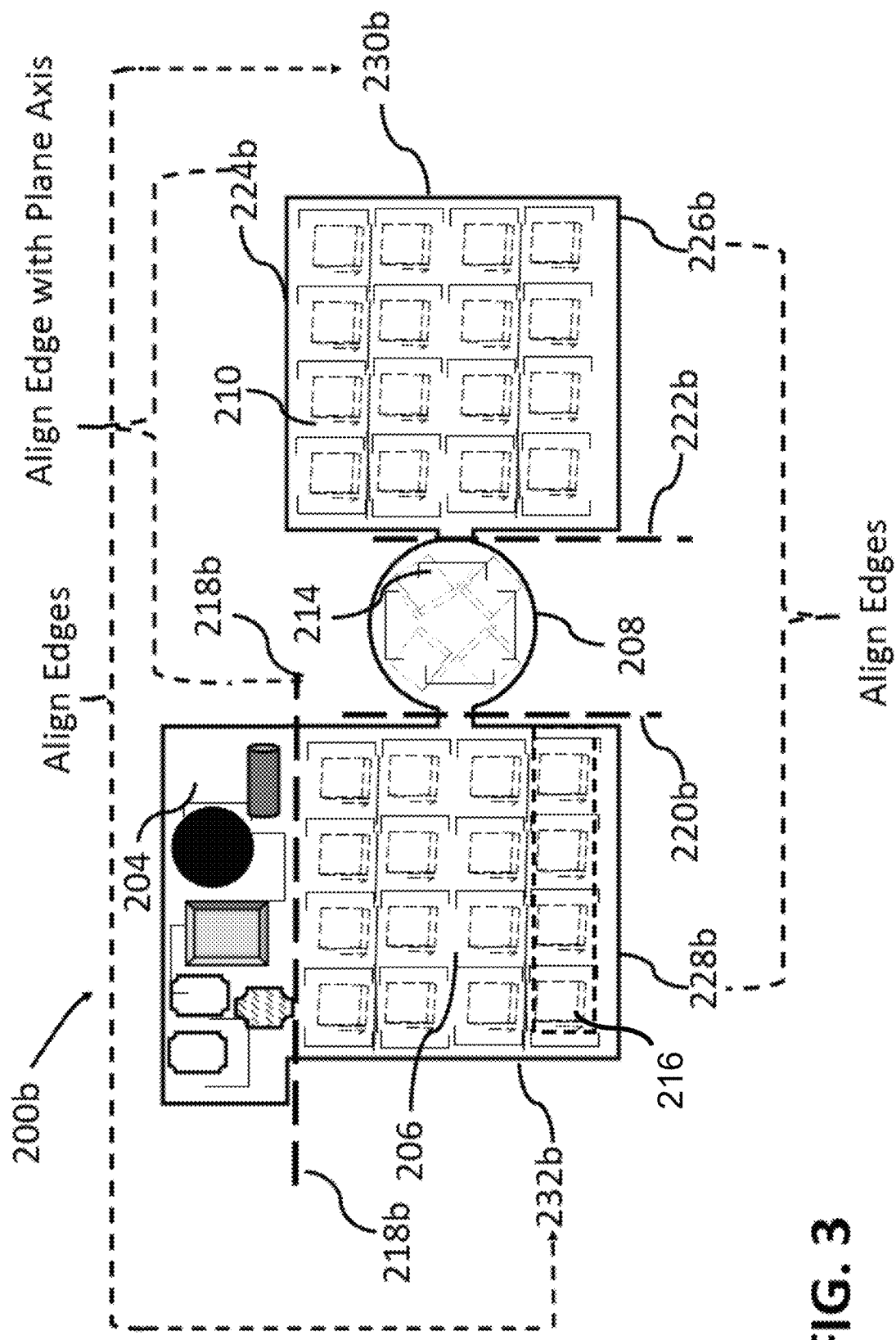
FIG. 3 is a schematic diagram of an LED lighting array in a planar configuration, according to an embodiment of the present disclosure.

Referring now to FIG. 3 (with cross reference to FIG. 2), a schematic diagram for the formation of light pipe 202 (FIG. 2) according to various embodiments is shown. In various embodiments, the said FPCB 200b having said surface portions are folded at one more perpendicular plane, via one more varying angle to form light pipe 202 into a semi-cylindrical light pipe. In a preferred embodiment, the FPCB is folded at a plane axis 218b between surface area portion 204 and surface area portion 206. In another preferred embodiment, the FCBC is folded at a plane axis 220b between surface area portion 206 and surface area portion 208 and similarly a plane axis 222b between surface area portion 208 and surface area portion 210. In a preferred embodiment, a semi-cylindrical light pipe is formed by folding the said one or more surface area portions as to encapsulate surface area portion 204 and surface driver elements within or internal to a formed lumen of the light pipe, enabling unobstructed light emission of one or more LED 214, LED array 216 from one or more surfaces of the light pipe 202. In another aspect, the FBCP is folded to position one or more perimeter edge 224b to co-align and parallel with plane axis 218b of surface portion area 204. In another aspect, the FBCP is folded to position one or more perimeter edge 226b of surface area portion 210 with perimeter edge 228b of surface area portion 206, preferably to co-align and parallel edge 226b with edge 228b, forming a semi-cylindrical light pipe with a length equivalent to the dimension of edge 226b or edge 228b, and a distal diameter equivalent to the diameter of circular surface area portion 208. In a preferred embodiment, the FBCP is folded to position one or more perimeter edge 230b of surface area portion 210 with perimeter edge 232b of surface area portion 206, whereby the length of perimeter edge 230b combined with the length of perimeter edge 232b forms the circumference of the proximal area portion 134 of FIG. 1, of semi-cylindrical light pipe 202. In a preferred embodiment, the FBCP is folded at plane axis 220b and 222b to position surface area portion 208 at the distal area portion 136 of FIG. 1. The one or more said folding steps results in a semi-cylindrical light pipe enabling unobstructed light emission of one or more LED 214, LED array 216 from one or more surfaces of the light pipe 202, in a multi-directional manner, within envelope 102 of FIG. 1.

Figure 4:
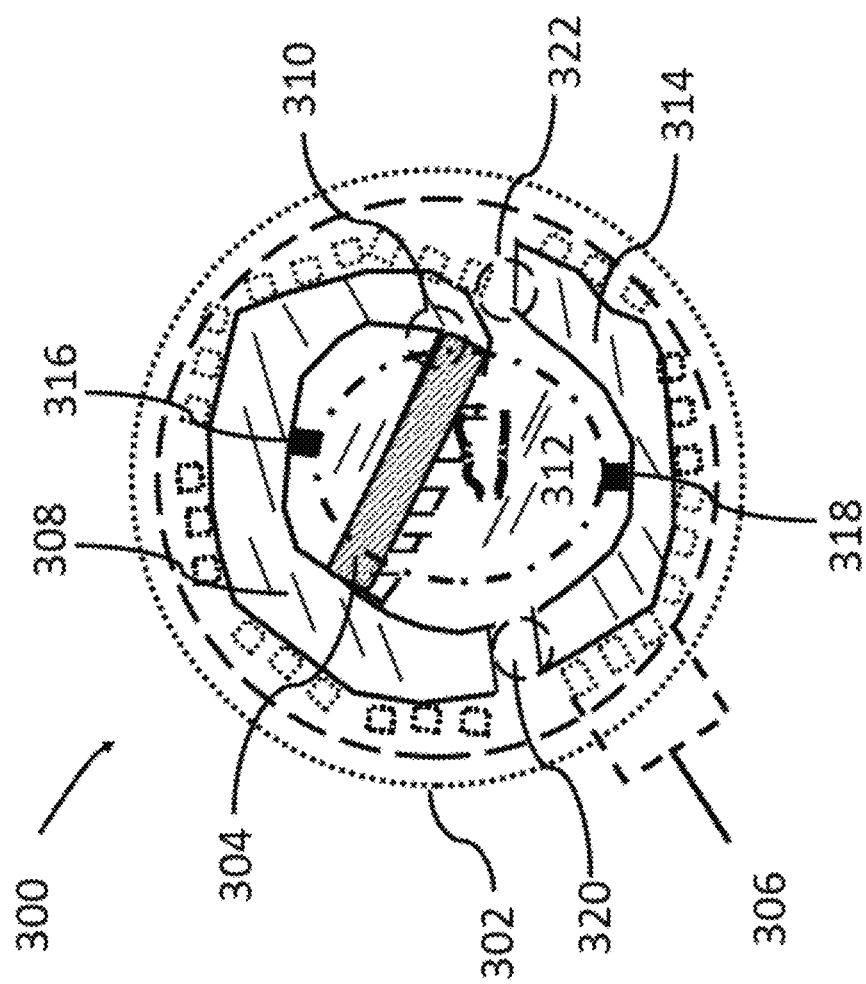
FIG. 4 is a schematic diagram of an LED lighting array in a rolled configuration, according to an embodiment of the present disclosure.

Referring now to FIG. 4, an illustration 300 of a perspective view of the light pipe folded and encapsulated within a diffuser, according to various embodiments is shown. Illustration 300 is a cross-sectional illustration of light pipe 202 comprising said folded FBCP positioned within the lumen of diffuser 302 corresponding to said diffuser 108 of FIG.1. Attention is drawn to one or more folded surface area portions to form light pipe 202. FBCP surface area portion 204 is folded within a formed lumen of the resulting light pipe, and for illustration purposes, not limited to actual scale dimensions, highlighted as element 304. It is an object of the present disclosure that element 304 and its surface components are positioned as to not obstruct light emission of one or more LED, or LED array 306, populated on the outer surface areas of one or more of one or more portions of light pipe 202. In various embodiments, element 308, equivalent to surface area portion 206, is folded at said plane axis 218, with respect to element 304, forming one or more varying angle 310 to enable encapsulation of element 304 within said formed lumen. In various embodiments, angle 310 comprises one or more angle, at least greater than 1 degree, preferably between 1 degree and 90 degrees with reference to plane axis 218. In a preferred embodiment, angle 310 is a variable angle to enable element 304 to fit within a substantial portion of the lumen formed within light pipe 202. It is another object of the present disclosure that FPCB is folded to position surface area portion 208 and its surface components (e.g., LEDs), illustrated herein as element 312, and surface area portion 210 and its surface components (e.g., LEDs), illustrated herein as element 314, by bending FPCB at junction 316 with plane axis 220 and at junction 318 with plane axis 222. In a preferred embodiment, junction 316 and junction 318 are folded resulting in a substantially 90-degree angle, positioning at least one axis of element 308 and element 314 to be perpendicular to the plane of element 312. In various embodiments, element 308 is further folded to form one semi-circular portion of light pipe 102. In another embodiment, element 314 is folded to form another semi-circular portion of light pipe 202. In a preferred embodiment, element 308 and element 314 are folded to position and align edge 226 and edge 228 adjacent one another at location 320. In another preferred embodiment, element 308 and element 314 are folded to position and align edge 224 with a length dimension of element 308 at location 322. In various embodiments, one or more longitudinal dimension of element 308 are connected to one or more longitudinal dimension of element 314 at location 320 forming a contiguous lumen having an inner and outer circumference of proximal portion 134 of light assembly 106, preferably the diameter of the outer circumference is less than the inner circumference of heatsink 116. In a preferred embodiment, the alignment and connection of one or more longitudinal dimension of element 308 to one or more longitudinal dimension of element 314 positions element 312 at the distal area portion 136 of light pipe 202. In various embodiments, one or more FPCB dimension, area portion, length, edge or elements are in physical contact or physically connected, using one or more means, including but not limited to, thermal bond, ultrasonic bond, chemical bond, sealant, glue, superglue, or the like. In alternative embodiments, one or more FPCB dimension, area portion, length, edge or elements are positioned in physical contact or in proximity to one another via contact, friction, by form, by shape, press fit, or the like.

Figure 5:
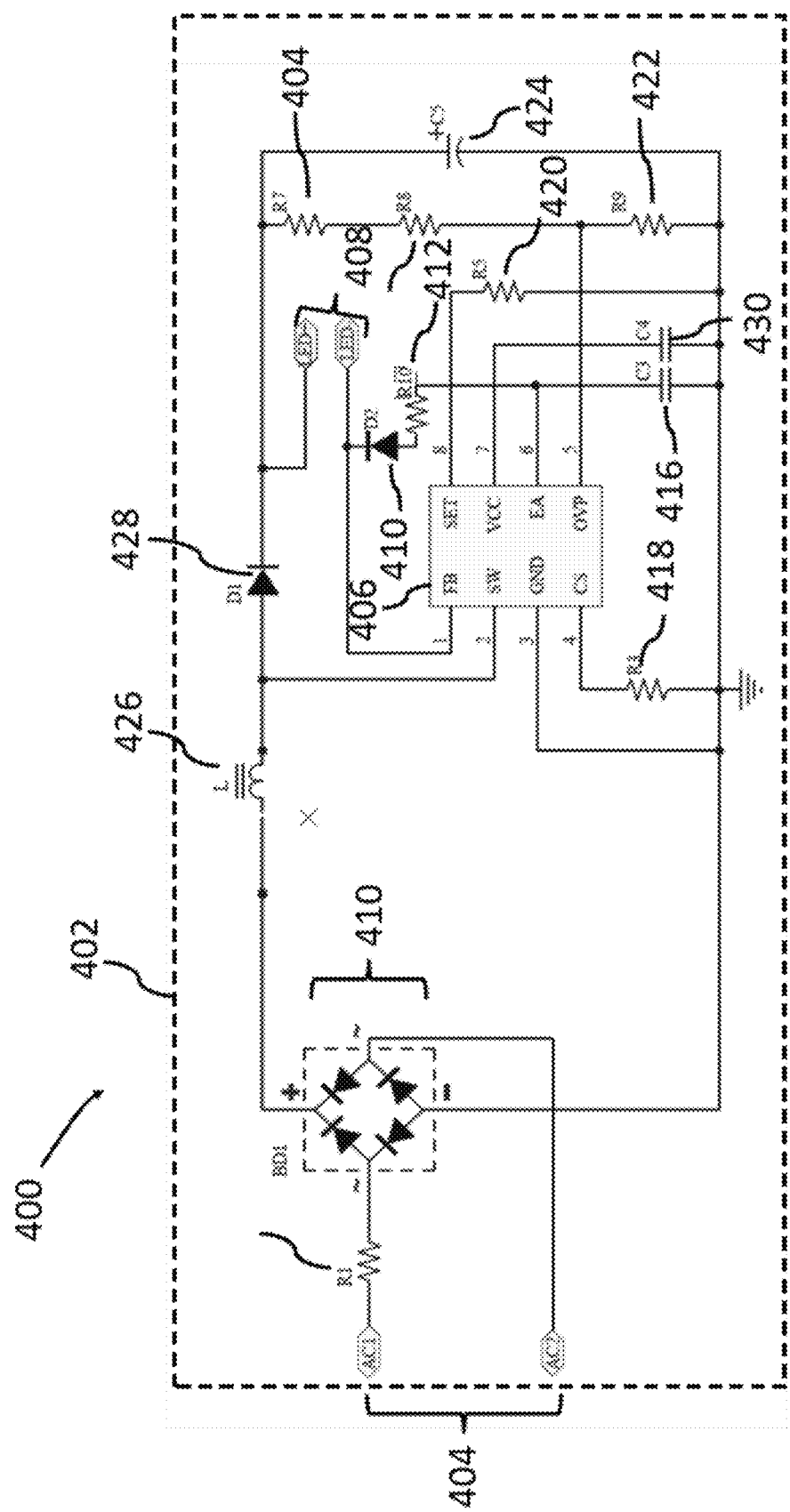
FIG. 5 is a circuit diagram of an LED driver, according to an embodiment of the present disclosure.

Referring now to FIG. 5, a circuit diagram 400 of a LED driver, according to various embodiments is shown. In various embodiments, LED driver 402 comprises one or more contact connection 404 for connection to at least one AC or DC power source (e.g. 120 V, 60 Hz, 12V DC etc.), at least one IC 406 for controlling/energizing the one or more circuit elements (e.g., diode, resistor, capacitor, etc.), one or more protection circuits within IC 406 or within LED driver 402, including but not limited to, over current limiter, over voltage limiter, under voltage lockout, output short protection, or the like. In a preferred embodiment, LED driver 402 is configured as a constant current driver, connected to one or more LED contact connection 408. In a preferred embodiment, LED driver 402 comprises at least one diode bridge 410, to convert one or more AC input signals to one or more DC signals. In various embodiments, LED driver 402 is configured as an isolation-type driver for safety. In another preferred embodiment, IC 406 is configured with an FB (e.g. feedback), EA (e.g. feedback error amp), CS (e.g., current sensing) input-output (I/O) pin, or combinations thereof, in combination with one or more diode 410, resistor 412, capacitor 416, and sensing resistor 418 to regulate current flow to one or more LED or LED array. In an embodiment, at least one SET I/O pin of IC 406 is connected to at least one resistor 420 and subsequently to GND (ground) to set one or more output current. In a preferred embodiment, the said configuration accurately regulates LED current independent of the input voltage and number of connected LEDs. In a preferred embodiment, the number of connected LEDs is at least 4, preferably 25, preferably 54, most preferably sufficient for the LED bulb of the present disclosure to generate 350 lumen or greater. In another embodiment, at least one OVP (e.g., over voltage protection) I/O pin of IC 406 is connected one or more resistor 422 and subsequently to GND to prevent the output voltage from exceeding a maximum switch voltage. In another embodiment, at least one OVP (e.g., over voltage protection) I/O pin of IC 406 is connected one or more electrolytic capacitor 424, preferably to mitigate the output current ripples. In various embodiments, LED driver 402 incorporates one or more buck or boost circuit topology for converting one or more input voltage, incorporating at least one inductor 426 for energy storage, in conjunction with one or more diode 428 to drive one or more LEDs via contact connectors 408. In an embodiment, one or more drain contact of one or more internal power switch circuit of IC 406 is powered by an output of the one or more buck or boost circuit via at least one SW I/O pin of IC 406. In another embodiment, one or more VCC I/O pin of IC 406 is connected to a capacitor 430 and subsequently to GND. In a preferred embodiment, one or more contact 404 is electrically connected to one or more connection 212, subsequently connected to one or more plug 126 of base 104.

Figure 6:
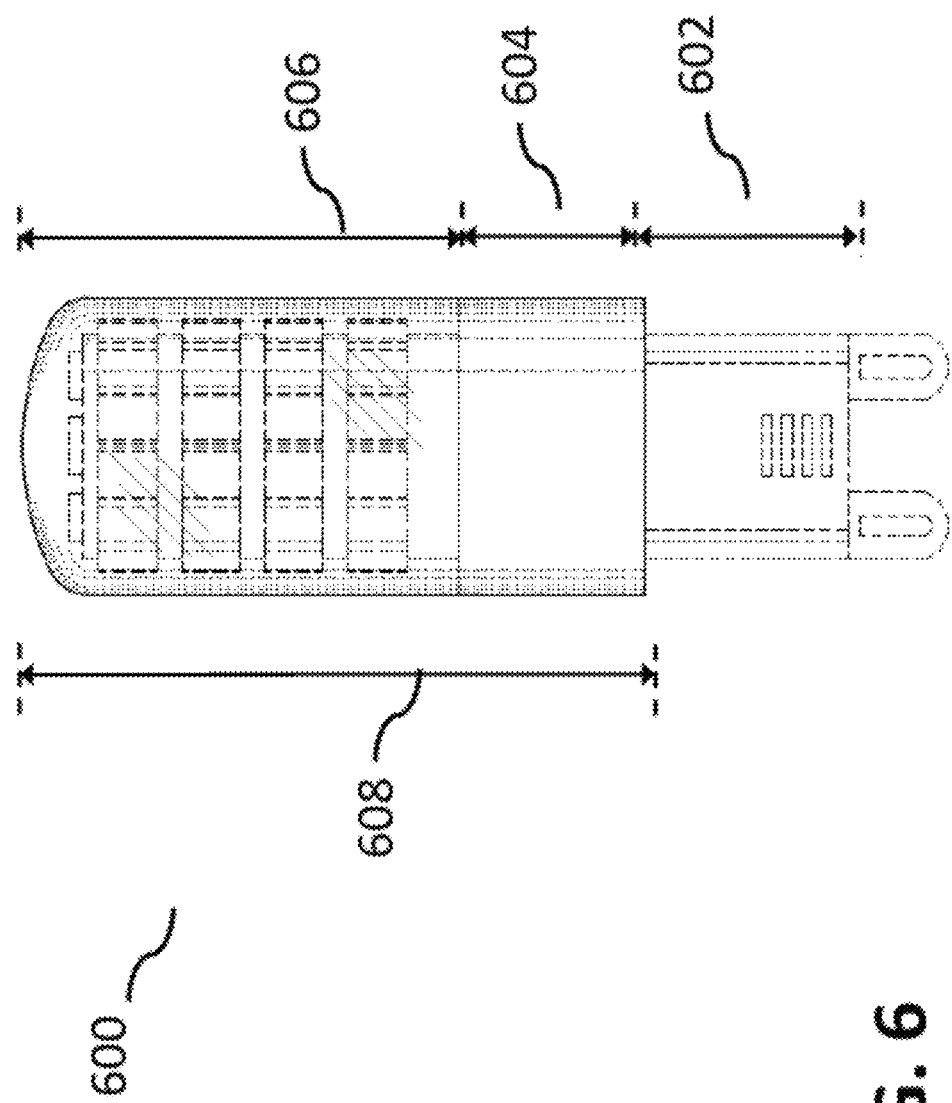
FIG. 6 is a front view of an assembled LED bulb, according to an embodiment of the present disclosure.

Referring to FIG. 6, a perspective view of an assembled LED bulb 600 of the present disclosure is shown. According to an embodiment, LED bulb 600 is comprised of a base portion 602, a body portion 604, and a diffuser or lens portion 606. Body portion 604 and lens portion 606 together define envelope 608. Envelope 608 may be substantially cylindrical in shape, and may comprise a radius in the range of about 13 mm to about 18 mm, and a length in the range of about 30 mm to about 50 mm. In certain embodiments, envelope 608 may be less than or equal to 75 mm in length and less than or equal to 25 mm in diameter. Body portion 604 may comprise dimensions in the range of about 10 mm to about 15 mm in height and a radius in the range of about 13 mm to about 18 mm. Lens portion 606 may comprise dimensions in the range of about 20 mm to about 30 mm in height and a radius in the range of about 13 mm to about 18 mm. In certain embodiments, base portion 602 and envelope 608 may together be less than or equal to 100 mm in length and 25 mm in diameter. Base portion 602 may comprise various electrical connections as are common in residential and commercial lighting fixtures; for example, an E12 Candelabra base. The functional characteristics of LED bulb 600, representative of one more embodiments of the present disclosure, are configured to achieve a plurality of Electrical, Photometric, and Thermal performance criteria to satisfy certain California Energy Commission (CEC) Program Requirements, described in detail below, within the dimensions of envelope 608.

Embodiments of the present disclosure are configured to enable specific performance characteristics within the form factor and size limitations of LED bulb 600, as shown and described in FIG. 6. These performance characteristics specifically include: CEC TITLE 20—Division 2—Chapter 4—Appliance Efficiency Regulation; CEC-400-2015-038-CMF Appendix JA8—Qualification Requirements for High Efficacy Light Sources; CEC-400-2015-038-CMF Appendix JA10—Test Method for Measuring Flicker of Lighting Systems; IESNA LM-79—2008: Electrical and Photometric Measurements of Solid State Lighting; ANSI NEMA ANSLG C78.377: 2015: Specifications of the Chromaticity of Solid State Lighting Products; UL 1993-2017: Standard for Safety—Self-Ballasted Lamps and Lamp Adapters Lamps. Table 1A is a summary of the CEC TITLE 20 REQUIREMENTS, and Table 1B is a summary of the CEC TITLE 24 REQUIREMENTS.

TABLE 1A

| CEC TITLE 20 REQUIREMENTS | |
|---|---|
| PROPERTY | REQUIREMENTS FOR STATE REGULATED LED LAMPS |
| Luminous Output | ≤2600 lm for all lamps<br>≥150 lm for candelabra bases<br>≥200 lm for all other bases<br>Equivalent Incandescent Wattage Claim - Medium Screw-Base or GU-24 Base:<br>40 W ≥ 310 lm  60 W ≥ 750 lm  75 W ≥ 1050 lm  100 W ≥ 1490 lm  150 W ≥ 2500 lm<br>Any Incandescent Comparison Claim:<br>Medium Screw Base ≥ 310 lm Intermediate and Candelabra bases ≥ 150 lm |
| Luminous Efficacy | 282 minimum compliance score, 68 lm/W (Jan. 1, 2018)<br>297 minimum compliance score, 80 lm/W (Jul. 1, 2019)<br>Compliance Score = (Efficacy + (2.3*CRI) |
| Zonal Distribution Requirements | ANSI standard A-Shape Lamps:<br>5% minimum of lumens in 130-180° zone<br>80% of measured cd values may vary by no more than 35% from average cd in 0-130° zone<br>no measured cd values may vary by more than 60% from average cd in 0-130° zone |
| Power Factor | ≥0.7 |
| Correlated Color Temperature (CCT) and DUV | Meets the requirements in Table 1 of Annex B of ANSI C78.377-2015 for color targets and color consistency - 4-Step Quadrangles.<br>Any Incandescent Comparison Claim:<br>≤3000K |

TABLE 1A-continued

| CEC TITLE 20 REQUIREMENTS | |
|---|---|
| PROPERTY | REQUIREMENTS FOR STATE REGULATED LED LAMPS |
| Color Rendering Index (CRI) | CRI-Ra ≥ 82<br>R1 through R8 individual scores ≥ 72 |
| Rated Life | ≥10,000 hours to DOE lumen maintenance and time to failure test procedure.<br>Lumen maintenance values ≤ 0.7:<br>Time of failure is equal to previously recorded lumen output measurement where lumen maintenance ≥ 0.7<br>Lumen maintenance values = 0.7:<br>Time to failure is equal to the test duration<br>Lumen maintenance values ≥ 0.7 and test duration < 3,000 hrs:<br>Time to failure is equal to the test duration<br>Lumen maintenance values ≥ 0.7 and test duration ≥ 3,000 hrs, < 6,000 hrs:<br>Time to failure is equal to the lesser of the TM-28 curve fit calculation or the test duration multiplied by the limiting multiplier.<br>(Limiting Multiplier = ((1/600) * test duration) − 4)<br>Lumen maintenance values ≥ 0.7 and test duration ≥ 6,000 hrs:<br>Time to failure is equal to the lesser of the TM-28 curve fit calculation or the test duration multiplied by 6. |
| Dimming | If Claiming Dimmable:<br>Dimmable to ≤ 10% of full light output |
| Reduced Flicker Operation | If Claiming Dimmable:<br>Light output modulation ≤ 30% for frequencies < 200 Hz |
| Noise | If Claiming Dimmable:<br>≤24 dBA at 100% and 20% of full light output |
| Standby Power | ≤0.2 W (Jul. 1, 2019) |

TABLE 1B

| CEC TITLE 24 REQUIREMENTS | |
|---|---|
| PROPERTY | REQUIREMENTS |
| Luminous Efficacy (JA 8.4.1) | The luminous efficacy of the light source shall be equal to or greater than 45 lumens/Watt when tested at its full light output. |
| Power Factor (JA 8.4.2) | The light source shall have a power factor equal to or greater than 0.90 when tested at its full light output. |
| Start Time (JA 8.4.3) | The light source shall have a start time no greater than 0.5 seconds. |
| Color Characteristics (JA 8.4.4) | Inseparable SSL luminaires, LED light engines, and GU24-based LED lamps shall be capable of providing a nominal Correlated Color Temperature (CCT) that is 4000 Kelvin or less and within 0.0033 Duv of the black body locus in the 1976 CIE color space.<br>All other light sources shall be capable of providing a nominal Correlated Color Temperature (CCT) that is 3000 Kelvin or less and within 0.0033 Duv of the black body locus in the 1976 CIE color space.<br>All light sources shall provide a Color Rendering Index (CRI) of 90 or higher and color rendering R9 value of 50 or higher when measured at a correlated color temperature and Duv value that comply with Section JA8.4.4. |
| Lumen Maintenance, Rated Life and Survival Rate# (JA 8.4.5) | The light source shall meet the lumen maintenance, rated life, and survival rate criteria when measured in accordance with the test method of Section JA8.3.5 and JA8.3.6.<br>(a) Lumen Maintenance: The percentage of initial light output after the 6,000 hour test must be equal to or greater than 86.7 percent. For inseparable SSL luminaires referencing the in-situ measurement temperature of the LED, complying products shall have IES LM-80 test results that produce an IES TM-21 projected L70 of at least 25,000 hours.<br>(b) Rated Life: The light source shall have a minimum rated lifetime of 15,000 hours.<br>(c) Survival Rate: 90 percent of tested units shall be operational at the completion of the 6,000 hour life test.<br>Exception to Section JA8.4.6(c): Inseparable SSL luminaires referencing the in-situ measurement temperature of the LED. |
| Dimming, Reduced Flicker Operation and Audible Noise# (JA 8.4.6) | The light source shall meet the following dimming, reduced flicker operation, and audible noise requirements when measured in accordance with the test method of Section JA8.3.7:<br>(a) The light source shall be dimmable down to 10 percent light output where 100 percent full light output is defined as operating the light source at the maximum setting provided by the control.<br>(b) LED-based light sources shall meet the requirements of NEMA standard SSL 7A as Type 1 or Type 2 products.<br>EXCEPTION to JA8.4.6(b): LED based light sources designed to be dimmed by controls other than forward phase cut dimmers.<br>(c) Light source in combination with specified control shall provide "reduced flicker operation" when tested at 100 percent and 20 percent of full light output, where reduced flicker operation is defined as having percent amplitude modulation (percent flicker) less than 30 percent at frequencies less than 200 Hz, tested according to the requirements in Joint Appendix JA-10.<br>Light source shall not emit audible noise above 24 dBA measured at 1 meter from the light source when tested at 100 percent and 20 percent of full light output. |

TABLE 1B-continued

CEC TITLE 24 REQUIREMENTS

| PROPERTY | REQUIREMENTS |
| --- | --- |
| Dimming, Reduced Flicker Operation and Audible Noise# (JA 8.4.6) | The light source shall meet the following dimming, reduced flicker operation, and audible noise requirements when measured in accordance with the test method of Section JA8.3.7:<br>(a) The light source shall be dimmable down to 10 percent light output where 100 percent full light output is defined as operating the light source at the maximum setting provided by the control.<br>(b) LED-based light sources shall meet the requirements of NEMA standard SSL 7A as Type 1 or Type 2 products.<br>EXCEPTION to JA8.4.6(b): LED based light sources designed to be dimmed by controls other than forward phase cut dimmers.<br>(c) Light source in combination with specified control shall provide "reduced flicker operation" when tested at 100 percent and 20 percent of full light output, where reduced flicker operation is defined as having percent amplitude modulation (percent flicker) less than 30 percent at frequencies less than 200 Hz, tested according to the requirements in Joint Appendix JA-10.<br>Light source shall not emit audible noise above 24 dBA measured at 1 meter from the light source when tested at 100 percent and 20 percent of full light output. |

Table 2 contains specifications of the LED bulb according to an embodiment of the present disclosure, and Table 3 is a summary of the results.

TABLE 2

LED Bulb and Testing Details

| | |
| --- | --- |
| MODEL NO: | EA-E12-5.0W-001-2790F-D |
| DESCRIPTION: | Omnidirectional Lamps |
| LED MODEL NO: | CREE J Series - 2835 |
| DRIVER MODEL NO: | N/A - Integrated To Lamp |
| LIGHT SOURCE: | LED |
| CEC T20 PRODUCT TYPE | Omnidirectional Lamp |
| CEC T24 PRODUCT TYPE | Omnidirectional Lamp |
| BASE TYPE: | E12 Candelabra Base |
| LAMP SHAPE: | Other |
| MINIMUM CLAIMED DIMMING | 5 |
| DIMMER MAKE AND MODEL: | LUTRON DVCL-153P |
| DIMMING TECHNOLOGY | Forward Phase Cut Controls |
| NEMA SSL 7A COMPATIBLE?: | Yes |
| LIFE TESTING AMBIENT TEMP | Between 20° C. and 35° C. |
| MODEL SIMILARITY NOTE FOR PRODUCT FAMILY: | E12 = base type.<br>27 = 2700K CCT<br>Other base types for this family includes: E11, BA15D, G8, G9 (where allowable per CEC program requirements)<br>Other CCTs allowed: 30 = 3000K |

TABLE 3

TEST SUMMARY

| CRITERIA | RESULTS |
| --- | --- |
| Lumen Output (lumens) | 491.4 |
| Input Power (W) | 4.88 |
| Lumen Efficacy (lm/W) | 103.0 |
| Minumum Compliance Score ( ) | 317.4 |
| Input Power Factor ( ) | 0.986 |
| Correlated Color Temperature (K) | 2787 |
| Color Rendering Index - Ra ( ) | 93.1 |
| Color Rendering Index - R1 ( ) | 94.1 |
| Color Rendering Index - R2 ( ) | 96.8 |
| Color Rendering Index - R3 ( ) | 96.1 |
| Color Rendering Index - R4 ( ) | 92.8 |
| Color Rendering Index - R5 ( ) | 93.1 |
| Color Rendering Index - R6 ( ) | 94.9 |
| Color Rendering Index - R7 ( ) | 92.6 |
| Color Rendering Index - R8 ( ) | 84.7 |
| Color Rendering Index - R9 ( ) | 66.5 |
| DUV ( ) | 0.0026 |
| Chromaticity Coordinate (x) | 0.449 |
| Chromaticity Coordinate (y) | 0.402 |
| Chromaticity Coordinate (u') | 0.259 |
| Chromaticity Coordinate (v') | 0.522 |
| Measured LED Source Temperature (° C.) | 92.8 |
| cdvalues > 35% ofavgcdvaluein0-130° zone(%) | 17.0 |
| cdvalues > 60% ofavgcdvaluein0-130° zone(%) | 0.0 |
| luminous flux in 110-180° zone (%) | 24.4 |
| luminous flux in 130-180° zone (%) | 9.0 |
| Start Time (ms) | 4.0 |
| Dimming (%) | 0.5 |

Several Test Methods were used and are disclosed as follow:

Photometric and Electrical Measurements—Integrating Sphere Method

A Spectroradiometer and two meter or ten-foot sphere was used to measure correlated color temperature, chromaticity coordinates, and the color rendering index for each SSL unit. Ambient temperature was measured at a position inside the sphere. Each SSL unit was operated on the client provided driver at the rated input voltage in its designated orientation. Each SSL unit was allowed to stabilize for at least thirty minutes before measurements were made. Stabilization procedures to LM-79 were followed. Electrical measurements including voltage, current, and power were measured using a power analyzer.

Photometric and Electrical Measurements—Distribution Method

A Type C Mirror Goniometer was used to measure the intensity (candelas) at each angle of distribution for the SSL sample. Ambient temperature was measured equal to the height of the sample mounted on the goniometer equipment. The SSL sample was operated on the client provided driver at rated input volts in its designated orientation. The SSL sample was allowed to stabilize for at least thirty minutes before measurements were made. Stabilization procedures to LM-79 were followed. Electrical measurements including voltage, current, and power were measured using a power analyzer.

In-Situ Maximum Measured Power Supply Case and Led Source Point Temperature

Power supply case and/or LED source operating temperature measurements were taken on one test sample per model with a thermocouple and temperature meter. The SSL sample was allowed to reach thermal equilibrium for three to seven and a half hours before measurements were taken.

Power supply or source temperature measurements were measured at the TMPps or Ts point as indicated by the included diagram in accordance with manufacturers declared thermal point location, or at a thermal point location found with a thermal camera when no diagram from the manufacturer is given. The maximum temperature was recorded for the sample. A simulated ceiling or other enclosure may be used in accordance to UL 1598, UL 153, or UL 1993 as applicable.

Dimming and Audible Noise

Dimming tests were performed on one sample with a photometer or oscilloscope. Each sample was allowed to stabilize at its highest dimming point and a relative light output measurement was taken. The sample was then dimmed to its lowest point without flickering and another relative light output measurement was taken. The dimming range percentage was then calculated. Noise was conducted at 20% light output at a distance of 1 meter. Six different positions were measured, and the maximum was recorded.

Standby Power Consumption

The standby power tests were performed on one fixture sample. A power analyzer or oscilloscope was used to record the electrical data during normal stabilized operation.

Reduced Flicker

The sample light output was allowed to stabilize in advance of taking measurements at each dimming level by ±2% light output. Light output was considered stabilized when consecutive measurements taken at one-minute intervals deviated by no more than 0.5%. For each dimming level after the lamps were stabilized, lighting measurements were recorded in volts from test equipment with readings taken at intervals of no greater than 50 microseconds. These readings were recorded for a test period of no less than one second.

The Percent Amplitude Modulation was calculated at unfiltered data, 40 Hz, 90 Hz, 200 Hz, 400 Hz, and 1000 Hz frequencies for each dimming level (100 percent, 20 percent, and minimum dimming claimed by the manufacturer).

Life Testing and Lumen Maintenance

Each SSL unit was tested in the integrating sphere for photometric performance every 1000 hours in the same physical configuration as it was tested at for zero hours. Unless otherwise identified, each SSL unit was operated in an ambient of 25° C.±5° C. in between measurements at the same orientation that was tested inside the sphere. Air movement and vibrations were minimized during the life test. The SSL unit was operated at the rated input voltage and frequency throughout the life and lumen maintenance test.

The candela distribution table is a tabular listing of the luminaire's candela readings at each given vertical angle when viewed from the side horizontally. In standard indoor photometry, the 0-degree vertical angle denotes the measurement directly below the luminaire (also referred to as nadir). Following from this, 90 degrees is at the equator. 180 degrees is directly above the luminaire (zenith).

Table 4 is a summary of the Photometric and Electrical Measurements (Distribution Method (25° C.±1° C.)).

TABLE 4

Photometric and Electrical Measurements (Distribution Method (25° C. ± 1° C.))

| BASE POSITION | INPUT VOLTAGE (VAC) | INPUT CURRENT (mA) | INPUT POWER (W) | LIGHT OUTPUT | BASE POSITION |
|---|---|---|---|---|---|
| Base Up | 120.04 | 49.3 | 4.99 | 511.5 | 102.6 |

Table 5 is a summary of the Intensity in Candelas.

TABLE 5

Intensity Summary (Candelas)

| ANGLE | 0 | 22.5 | 45 | 67.5 | 90 |
|---|---|---|---|---|---|
| 0 | 17 | 17 | 17 | 17 | 17 |
| 5 | 18 | 18 | 18 | 18 | 18 |
| 10 | 19 | 19 | 20 | 20 | 20 |
| 15 | 22 | 22 | 23 | 23 | 22 |
| 20 | 26 | 26 | 26 | 26 | 26 |
| 25 | 30 | 30 | 30 | 30 | 30 |
| 30 | 34 | 34 | 34 | 34 | 33 |
| 35 | 37 | 38 | 37 | 38 | 36 |
| 40 | 40 | 41 | 40 | 41 | 39 |
| 45 | 43 | 44 | 43 | 43 | 42 |
| 50 | 46 | 46 | 45 | 46 | 44 |
| 55 | 47 | 48 | 47 | 47 | 46 |
| 60 | 49 | 49 | 47 | 48 | 47 |
| 65 | 50 | 49 | 48 | 49 | 48 |
| 70 | 50 | 49 | 48 | 49 | 48 |
| 75 | 50 | 49 | 48 | 49 | 48 |
| 80 | 50 | 49 | 47 | 49 | 48 |
| 85 | 50 | 49 | 47 | 49 | 48 |
| 90 | 50 | 48 | 47 | 49 | 48 |
| 95 | 50 | 48 | 47 | 48 | 48 |
| 100 | 49 | 47 | 46 | 47 | 47 |
| 105 | 48 | 46 | 45 | 46 | 45 |
| 110 | 46 | 45 | 43 | 45 | 44 |
| 115 | 44 | 43 | 41 | 42 | 41 |
| 120 | 41 | 40 | 39 | 40 | 39 |
| 125 | 38 | 37 | 36 | 37 | 36 |
| 130 | 34 | 34 | 33 | 34 | 32 |
| 135 | 31 | 30 | 29 | 30 | 29 |
| 140 | 26 | 26 | 26 | 26 | 25 |
| 145 | 22 | 22 | 21 | 22 | 21 |
| 150 | 18 | 17 | 17 | 17 | 16 |
| 155 | 12 | 12 | 12 | 12 | 12 |
| 160 | 6 | 6 | 6 | 6 | 7 |

Figure 7:
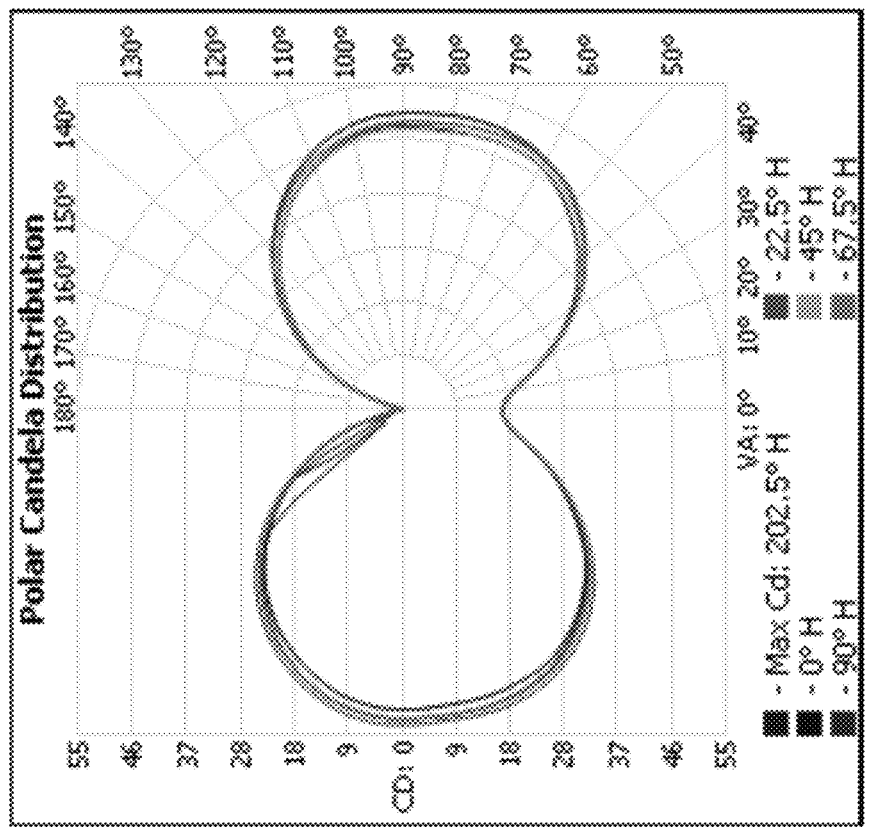
FIG. 7 is a polar plot of the intensity distribution of a tested LED bulb, according to an embodiment of the present disclosure.

A polar distribution diagram, also called a polar curve, is a graph showing how luminous intensity values vary with increasing angles from the imaginary axis of the lamp. Referring to FIG. 7, plot 700 comprises a polar plot of the intensity distribution of the tested LED bulb. This is a graphical representation of the candela distribution. The angles marked on the edges are vertical angles with 0 pointed straight down. The displacement from the origin is the candela reading in candelas per rated lumens. The intensity distribution demonstrates an emission distribution range according to a specific embodiment of the present disclosure.

Table 6 is a summary of the Illuminance of LED bulb at a distance mounted at a height of 10 ft.

TABLE 6

Illuminance - Cone of Light

| DISTANCE | CENTER BEAM fc |
|---|---|
| 1.7 ft | 5.92 fc |
| 3.3 ft | 1.57 fc |

TABLE 6-continued

Illuminance - Cone of Light

| DISTANCE | CENTER BEAM fc |
|---|---|
| 5.0 ft | 0.68 fc |
| 6.7 ft | 0.38 fc |
| 8.3 ft | 0.25 fc |
| 10.0 ft | 0.17 fc |

Figure 8:
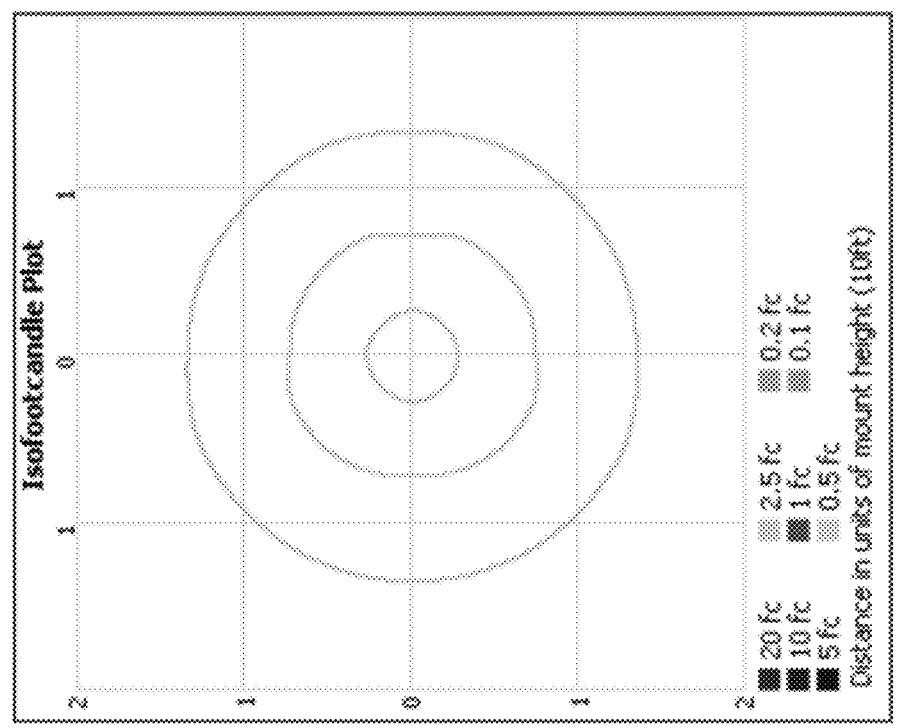
FIG. 8 is an iso-illumination plot of a tested LED bulb, according to an embodiment of the present disclosure; and, FIG. 9 is a plot of the spectral distribution of the emission from a tested LED bulb over the visible wavelength, according to an embodiment of the present disclosure.

Referring to FIG. 8, plot 800 comprises an iso-illumination plot of LED bulb mounted at a height of 10 ft.

Table 7 is a summary of the Zonal Lumen and the Percentages in each zone.

TABLE 7

Zonal Lumen Summary and Percentages

| ZONE | LUMENS | % LUMINAIRE | ZONE | LUMENS | % LUMINAIRE |
|---|---|---|---|---|---|
| 0-30 | 22.1 | 4.3 | 0-10 | 1.7 | 0.3 |
| 0-40 | 45.8 | 9.0 | 10-20 | 6.4 | 1.3 |
| 0-60 | 123.0 | 24.0 | 20-30 | 14.0 | 2.7 |
| 60-90 | 158.4 | 31.0 | 30-40 | 23.7 | 4.6 |
| 0-90 | 281.4 | 55.0 | 40-50 | 34.0 | 6.6 |
| 90-180 | 230.1 | 45.0 | 50-60 | 43.2 | 8.4 |
| 0-180 | 511.5 | 100.0 | 60-70 | 49.9 | 9.8 |
| 70-80 | 53.5 | 10.5 | 120-130 | 34.9 | 6.8 |
| 80-90 | 55.0 | 10.7 | 130-140 | 24.7 | 4.8 |
| 90-100 | 54.6 | 10.7 | 140-150 | 14.3 | 2.8 |
| 100-110 | 50.8 | 9.9 | 150-160 | 6.0 | 1.2 |
| 110-120 | 44.0 | 8.6 | 160-170 | 0.8 | 0.2 |

Table 8 is a summary of the test results of electrical measurements using the integrating sphere method.

TABLE 8

Electrical Measurements - Integrating Sphere Method (25° C. ± 1° C.)

| BASE POSITION | INPUT VOLTAGE (VAC) | INPUT CURRENT (mA) | INPUT POWER (W) | INPUT CURRENT ATHD (%) |
|---|---|---|---|---|
| Base Up | 120.02 | 47.2 | 4.83 | 21.01 |
| Base Up | 120.02 | 49.7 | 5.09 | 21.23 |
| Base Up | 120.01 | 46.9 | 4.83 | 20.80 |
| Base Up | 120.04 | 46.1 | 4.72 | 24.10 |
| Base Up | 120.03 | 47.8 | 4.88 | 23.94 |
| Base Down | 120.00 | 49.2 | 5.06 | 21.40 |
| Base Down | 120.01 | 47.7 | 4.88 | 23.07 |
| Base Down | 120.01 | 48.3 | 4.97 | 25.05 |
| Base Down | 120.02 | 45.7 | 4.65 | 21.83 |
| Base Down | 120.04 | 47.5 | 4.89 | 21.28 |

Table 9 is a summary of the test results of photometric measurements using the integrating sphere method.

TABLE 9

Photometric Measurements - Integrating Sphere Method (25° C. ± 1° C.)

| LIGHT OUTPUT (lm) | LUMEN EFFICACY (lm/W) | CORRELATED COLOR TEMPERATURE - CCT (K) | CRI - Ra ( ) | DUV ( ) | MINIMUM COMPLIANCE SCORE |
|---|---|---|---|---|---|
| 501.4 | 103.8 | 2787 | 93.3 | 0.0025 | 318.3 |
| 524.4 | 103.0 | 2787 | 93.2 | 0.0025 | 317.4 |
| 500.9 | 103.8 | 2795 | 93.3 | 0.0025 | 318.3 |
| 493.6 | 104.7 | 2785 | 93.3 | 0.0025 | 319.2 |
| 504.9 | 103.5 | 2790 | 93.2 | 0.0026 | 318.0 |
| 520.7 | 103.0 | 2786 | 93.3 | 0.0025 | 317.6 |
| 510.5 | 104.6 | 2782 | 93.3 | 0.0025 | 319.1 |
| 514.7 | 103.5 | 2787 | 93.1 | 0.0025 | 317.7 |

TABLE 9-continued

Photometric Measurements - Integrating Sphere Method (25° C. ± 1° C.)

| LIGHT OUTPUT (lm) | LUMEN EFFICACY (lm/W) | CORRELATED COLOR TEMPERATURE - CCT (K) | CRI - Ra ( ) | DUV ( ) | MINIMUM COMPLIANCE SCORE |
|---|---|---|---|---|---|
| 491.4 | 105.6 | 2787 | 93.3 | 0.0024 | 320.2 |
| 509.7 | 104.3 | 2785 | 93.3 | 0.0025 | 318.8 |

The ability of the light sources to render the true colors of an object (referred to as color rendering) is a very important measure of light quality and product utility for consumers. The internationally recognized metric is the Color Rendering Index (CRI) metric, which utilizes a scale from 0 to 100. CRI is a measure of how accurately a light source renders the colors of the objects being illuminated, compared to a reference light source of the same color temperature. For lower color temperature light, the reference source is a theoretical black body radiator when heated to the specific temperature in question (in K). For higher color temperatures, the reference source is daylight of the same color temperature. For practical purposes an incandescent filament is considered to be essentially equivalent to the theoretical black body; incandescent lamps are therefore generally said to have a CRI of 100 by definition. While 100 CRI is considered as a perfect light quality (no color distortion), an 80 CRI source (20 units from 100) could be considered to have twice as much color distortion or color inaccuracy as a 90 CRI source (10 units from 100).

Many manufacturers report their R9 values, the color rendering value for a ninth, saturated red color. This value is an important indicator because it indicates how well a lamp accurately renders common materials such as skin tones, wood, food, and earth tones. High quality LED lamps can have higher R9 CRI values (50+) than T8 lamps and poor-quality LED lamps.

Table 10 is a summary of the Photometric Measurements of CRI (R1-R9) of LED bulb using the Integrating Sphere Method.

TABLE 10

Photometric Measurements of CRI (R1-R9) Summary

| CRI-R1 ( ) | CRI-R2 ( ) | CRI-R3 ( ) | CRI-R4 ( ) | CRI-R5 ( ) | CRI-R6 ( ) | CRI-R7 ( ) | CRI-R8 ( ) | CRI-R9 ( ) |
|---|---|---|---|---|---|---|---|---|
| 94.3 | 96.6 | 96.1 | 93.0 | 93.3 | 95.0 | 92.8 | 85.0 | 67.1 |
| 94.2 | 96.6 | 96.3 | 92.8 | 93.2 | 95.0 | 92.7 | 84.7 | 66.7 |
| 94.3 | 96.6 | 96.2 | 92.9 | 93.3 | 95.0 | 92.8 | 84.9 | 67.0 |
| 94.3 | 96.7 | 96.2 | 92.9 | 93.3 | 95.1 | 92.7 | 84.9 | 67.0 |
| 94.3 | 96.7 | 96.3 | 92.9 | 93.3 | 95.1 | 92.6 | 84.8 | 66.9 |
| 94.3 | 96.8 | 96.4 | 92.9 | 93.4 | 95.2 | 92.7 | 84.8 | 67.0 |
| 94.3 | 96.7 | 96.3 | 92.9 | 93.3 | 95.1 | 92.7 | 84.8 | 66.9 |
| 94.1 | 96.5 | 96.1 | 92.8 | 93.1 | 94.9 | 92.7 | 84.7 | 66.5 |
| 94.3 | 96.7 | 96.3 | 93.0 | 93.3 | 95.1 | 92.8 | 84.9 | 67.1 |
| 94.3 | 96.6 | 96.2 | 92.9 | 93.3 | 95.0 | 92.7 | 84.9 | 67.0 |

Table 11 is a summary of the chromaticity coordinates for LED bulb.

TABLE 11

Chromaticity Coordinate Summary

| CIE 1931 CHROMATICITY COORDINATE (x) | CIE 1931 CHROMATICITY COORDINATE (y) | CIE 1976 CHROMATICITY COORDINATE (u') | CIE 1976 CHROMATICITY COORDINATE (v') |
|---|---|---|---|
| 0.449 | 0.402 | 0.259 | 0.522 |
| 0.449 | 0.402 | 0.259 | 0.522 |
| 0.448 | 0.402 | 0.259 | 0.522 |
| 0.449 | 0.402 | 0.260 | 0.522 |
| 0.448 | 0.401 | 0.259 | 0.522 |
| 0.449 | 0.402 | 0.259 | 0.522 |
| 0.449 | 0.402 | 0.260 | 0.522 |
| 0.449 | 0.402 | 0.259 | 0.522 |
| 0.449 | 0.402 | 0.259 | 0.522 |
| 0.449 | 0.402 | 0.260 | 0.522 |

Figure 9:
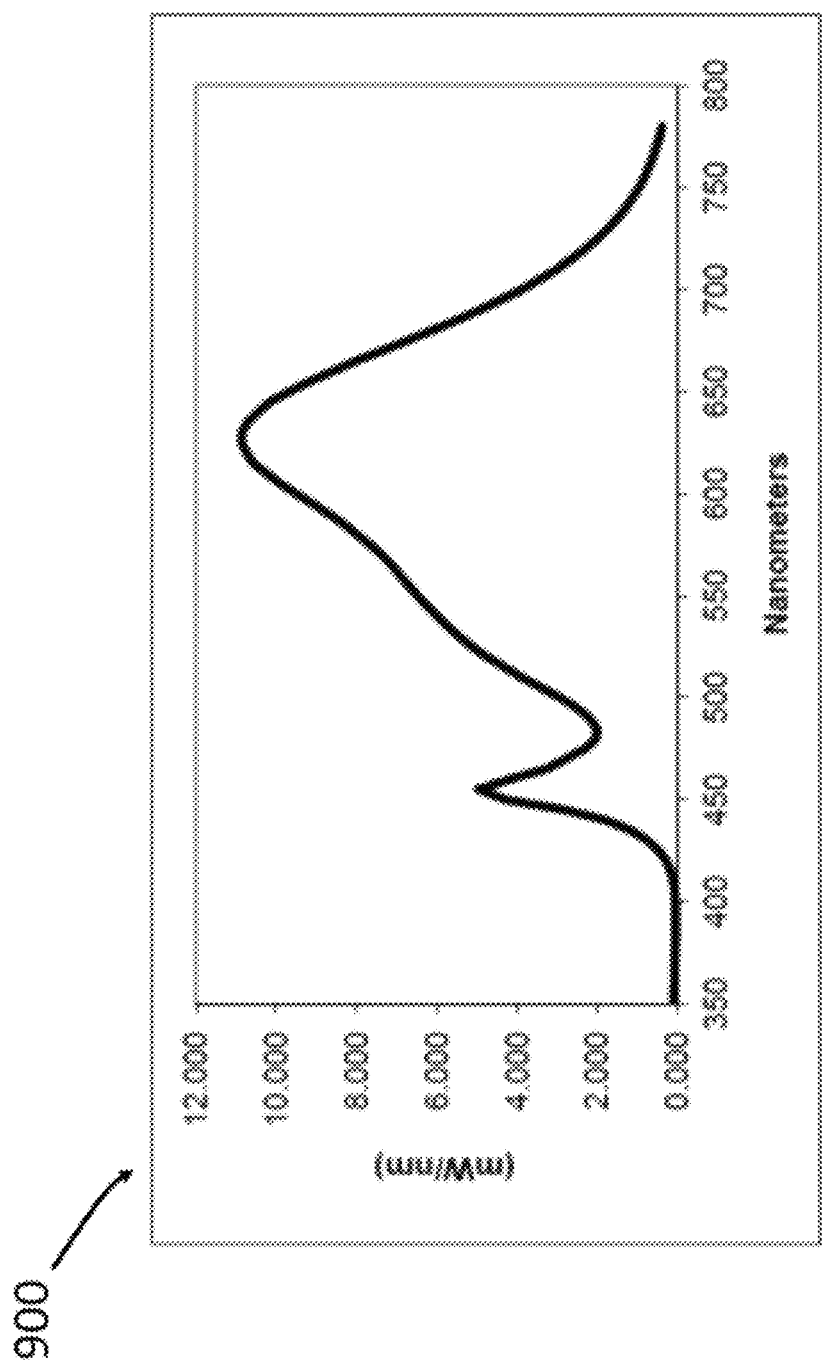

Referring to FIG. 9, a plot 900 comprises the spectral distribution of the emission from said tested LED bulb over the visible wavelength.

Temperature has a significant effect on the deterioration of LEDs with most of the input energy being converted into heat (US DOE, 2007. Thermal Management of white LEDs), whereby higher temperatures result in higher levels of degradation. The ability of an LED replacement lamp to manage heat affects its performance, lumen output, CCT, longevity (lumen maintenance), and safety. LED is a semiconductor device that has a low melting temperature and therefore requires heat transfer to keep the junction temperature below a certain temperature limit (typically 125° C.).

The in-situ source temperature of said LED bulb was measured using an open-air box-lamp and the test parameters and results are summarized in Table 12.

TABLE 12

LED Source Temperature Measurement Summary
LED Source Temperature Measurement Summary Maximum Junction Temperature from LED specification (Tj) = 125° C.
Thermal Resistance Formula from LED specification = 20° C./W
Maximum Forward Voltage (Vf) from LED specification = 3.3 V
Measured LED Current = 37 mA
Calculated LED Wattage = Vf × Measured LED Current = 0.122 W
MaximumSourceTemperature(Ts) = Tj − (LEDWattage × Thermal Resistance) = 122.56° C.

The maximum measured LED temperature was 92.8° C. and according to the manufacturer's supporting document, the maximum rated LED temperature is 122.5° C. Therefore, the LED bulb of the present disclosure operates at 75% operating temperature relative to its maximum rated temperature.

The start time was measured at 4.0 milliseconds and programmed aesthetic fade-in is allowed for in CEC T24 JA8.

An advantage of LEDs is that they generally maintain their efficacy when dimmed, as opposed to incandescent lamps which experience dramatically reduced efficacy when dimmed. This means that dimming an LED lamp to 50% light output also reduces power by about 50%, resulting in significant energy savings. The dimming ability of LED bulb was tested and determined to be 0.5% dimmable with minimum light output of 80.0 lux relative to a maximum light output of 14900.00 lux.

The existence of perceptible flicker in a light source (and/or levels of flicker that result in reduced visual performance or adverse health risks for end users) is a major impediment to the adoption of that light source. Flicker (specifically photometric flicker) is defined as the modulation of luminous flux, and it generally exists to some extent in all major lighting technologies, including incandescent, halogen, metal halide, fluorescent, and LED.

The reduced flicker of LED bulb has been tested and the results are summarized in Table 13 (100% dim level), Table 14 (20% dim level), and Table 15 (minimum claimed dim level).

TABLE 13

| 100% Dim Level - Full on Summary | | | | |
|---|---|---|---|---|
| INPUT VOLTAGE (VAC) | INPUT CURRENT (mA) | INPUT POWER (W) | INPUT POWER FACTOR ( ) | INPUT CURRENT ATHD (%) |
| 113.67 | 50.2 | 5.25 | 0.921 | 21.38 |
| FREQUENCY FILTER (Hz) | MAXIMUM LIGHT OUTPUT (mV) | MINIMUM LIGHT OUTPUT (mV) | PERCENT AMPLITUDE MODULATION (%) | |
| Unfiltered | 196.343 | 195.902 | 0.1 | — |
| 1000 Hz | 196.343 | 195.921 | 0.1 | — |
| 400 Hz | 196.209 | 195.921 | 0.1 | — |

TABLE 13-continued

| | | 100% Dim Level - Full on Summary | | |
|---|---|---|---|---|
| 200 Hz | 196.094 | 195.941 | 0.0 | — |
| 90 Hz | 196.019 | 196.000 | 0.0 | — |
| 40 Hz | 196.000 | 196.000 | 0.0 | — |

TABLE 14

| | | 20% Dim Level Summary | | |
|---|---|---|---|---|
| INPUT VOLTAGE (VAC) | INPUT CURRENT (mA) | INPUT POWER (W) | INPUT POWER FACTOR ( ) | INPUT CURRENT ATHD (%) |
| 51.75 | 28.1 | 1.27 | 0.871 | 76.12 |

| FREQUENCY FILTER (Hz) | MAXIMUM LIGHT OUTPUT (mV) | MINIMUM LIGHT OUTPUT (mV) | PERCENT AMPLITUDE MODULATION (%) | |
|---|---|---|---|---|
| Unfiltered | 39.669 | 39.337 | 0.4 | — |
| 1000 Hz | 39.630 | 39.327 | 0.4 | — |
| 400 Hz | 39.630 | 39.346 | 0.4 | — |
| 200 Hz | 39.594 | 39.382 | 0.3 | — |
| 90 Hz | 39.516 | 39.461 | 0.1 | — |
| 40 Hz | 39.500 | 39.500 | 0.0 | — |

TABLE 15

| | | Minimum Claimed Dim Level | | |
|---|---|---|---|---|
| INPUT VOLTAGE (VAC) | INPUT CURRENT (mA) | INPUT POWER (W) | INPUT POWER FACTOR ( ) | INPUT CURRENT ATHD (%) |
| 31.23 | 21.3 | 0.54 | 0.807 | 110.96 |

| FREQUENCY FILTER (Hz) | MAXIMUM LIGHT OUTPUT (mV) | MINIMUM LIGHT OUTPUT (mV) | PERCENT AMPLITUDE MODULATION (%) | |
|---|---|---|---|---|
| Unfiltered | 2.759 | 2.683 | 1.4 | — |
| 1000 Hz | 2.740 | 2.683 | 1.1 | — |
| 400 Hz | 2.740 | 2.702 | 0.7 | — |
| 200 Hz | 2.740 | 2.721 | 0.3 | — |
| 90 Hz | 2.740 | 2.740 | 0.0 | — |
| 40 Hz | 2.740 | 2.740 | 0.0 | — |

The lumen maintenance and rate life of LED bulb were tested at 1500, 2000, 3000, and 4000 hrs. Table 16 is a summary of the results at 4000 hrs of testing.

TABLE 16

| | Lumen Maintenance and Rate Life - 4000 hrs | |
|---|---|---|
| LIGHT OUTPUT (lm) | LUMEN EFFICACY (lm/W) | LUMEN MAINTENANCE (%) |
| 501.7 | 102.4 | 100.1 |
| 519.4 | 100.7 | 99.0 |
| 500.5 | 102.1 | 99.9 |
| 496.0 | 103.4 | 100.5 |
| 507.7 | 102.7 | 100.6 |
| 520.0 | 101.3 | 99.9 |
| 509.0 | 102.9 | 99.7 |
| 513.4 | 103.4 | 99.7 |
| 493.1 | 103.8 | 100.3 |
| 511.3 | 102.9 | 100.3 |

An object of the present disclosure is an LED bulb having one or more form factor, dimension, size, shape, or volume, configured and powered by said LED driver, demonstrated through one or more said tests, providing preferably at least about 1000, 2000, 3000, 4000, 5,000 hours, more preferably at least about 10,000 hours, more preferably still at least about 20,000 hours, more preferably still at least about 300,000 hours, more preferably still at least about 50,000 hours.

An object of the present disclosure is a bulb having one or more form factor, dimension, size, shape, or volume, incorporating a variety of bases, to duplicate, replace, or retrofit one or more standard INC or halogen light source, lamp, bulb, or the like. In various embodiments, the chosen base comprises, but is not limited to, A, PS, B, C, CA, RP, S, F, MR, BR, G, T, BT, E, ED, AR, PAR series. In a preferred embodiment, the base comprises BA15S, G4, G4 Wafer, GY6.35, S8, T5, BA15D, E11, E12, G8, G9 series. In an alternative, the said bulb is a stand-alone integrated LED lamp for use in one or more outdoor applications, indoor applications, stadium, venue, transportation vehicle (e.g., automobile, bus, motorcycle, airplane, etc.) in any luminaire, light fixture, or appliance, including but not limited to bath lights, pendants, ceiling fans, portable lamp, chandeliers, cabinet, house fix, flush mount, wall sconces, or the like.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment.

Thus, the following claims are hereby incorporated into the Detailed Description, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A miniature light emitting diode (LED) light bulb comprising:
   a base portion including one or more electrical contacts arranged to mate with an electrical receptacle to receive electric current;
   an envelope portion comprising:
      a substantially cylindrical body portion coupled to the base portion;
      a heat sink coupled to an inner circumference of the body portion; and
      a substantially cylindrical light diffusing portion coupled to an upper circumference of the body portion, the light diffusing portion and the body portion defining an interior portion of the envelope portion, the envelope portion being less than 75 mm in length and less than 25 mm in diameter; and
   an LED light assembly being housed in the interior portion of the envelope portion, the LED light assembly comprising:
      a flexible printed circuit board;
      a plurality of LEDs being disposed on a surface of the flexible printed circuit board, the plurality of LEDs being electrically and thermally connected to comprise an LED array; and
      an electronics assembly being disposed on the surface of the flexible printed circuit board and comprising an LED driver and an integrated circuit being operably engaged with the one or more electrical contacts and the plurality of LEDs to provide power to the LED array,
      wherein the LED array and the electronics assembly are operably configured to comprise a luminous efficiency of at least 45 lumens per watt,
      wherein the flexible printed circuit board is folded at one or more plane axis to define a radial arrangement of the plurality of LEDs.

2. The miniature LED light bulb of claim 1 wherein the LED array and the electronics assembly are operably configured to comprise a power factor of greater than or equal to 90% when engaged at a full light output.

3. The miniature LED light bulb of claim 1 wherein the heat sink comprises a ceramic substrate being housed in a metal tube.

4. The miniature LED light bulb of claim 1 wherein the LED array and the electronics assembly are operably configured to comprise a nominal correlated color temperature of less than or equal to 4000 Kelvin.

5. The miniature LED light bulb of claim 1 wherein the LED array and the electronics assembly are operably configured to comprise a color rendering index of at least 90.

6. The miniature LED light bulb of claim 1 wherein the LED array and the electronics assembly are operably configured to comprise a rated lifetime of at least 15,000 hours.

7. The miniature LED light bulb of claim 1 wherein the LED array and the electronics assembly are operably configured such that the plurality of LEDs is dimmable to at least 10 percent of full light output.

8. The miniature LED light bulb of claim 1 wherein the LED array and the electronics assembly are operably configured to enable a percent amplitude modulation of less than 30 percent at frequencies less than 200 Hz.

9. The miniature LED light bulb of claim 1 wherein the LED array and the electronics assembly are operably configured to comprise an audible output of less than 24 dBA when the LED array is engaged at 100 percent and 20 percent of full light output.

10. A miniature light emitting diode (LED) light bulb comprising:
   a base portion including one or more electrical contacts arranged to mate with an electrical receptacle to receive electric current;

an envelope portion comprising:
  a substantially cylindrical body portion coupled to the base portion;
  a heat sink coupled to an inner circumference of the body portion; and
  a substantially cylindrical light diffusing portion coupled to an upper circumference of the body portion, the light diffusing portion and the body portion defining an interior portion of the envelope portion, the envelope portion being less than 75 mm in length and less than 25 mm in diameter; and,
an LED light assembly being housed in the interior portion of the envelope portion, the LED light assembly comprising:
a flexible printed circuit board being less than or equal to 95 millimeters in length and less than or equal to 30 millimeters in width when in a planar configuration;
a plurality of LEDs disposed on a surface of the flexible printed circuit board, the plurality of LEDs being electrically and thermally connected to comprise an LED array; and
an electronics assembly disposed on the surface of the flexible printed circuit board, the electronics assembly comprising an LED driver and an integrated circuit being operably engaged with one or more electrical contacts to receive electricity and operably engaged with the plurality of LEDs to provide power to the LED array, the LED array and the electronics assembly being operably configured to comprise a luminous efficiency of at least 45 lumens per watt,
  wherein the flexible printed circuit board is folded at one or more plane axis to define a radial arrangement of the LED array.

11. The miniature LED light bulb of claim 10 wherein the LED array and the electronics assembly are operably configured to comprise a power factor of greater than or equal to 90% when engaged at a full light output.

12. The miniature LED light bulb of claim 10 wherein the LED array and the electronics assembly are operably configured to enable a percent amplitude modulation of less than 30 percent at frequencies less than 200 Hz.

13. The miniature LED light bulb of claim 10 wherein the LED array and the electronics assembly are operably configured such that the plurality of LEDs is dimmable to at least 10 percent of full light output.

14. The miniature LED light bulb of claim 10 wherein the heat sink comprises a metal tube operably engaged with a ceramic substrate.

15. The miniature LED light bulb of claim 10 wherein the LED array and the electronics assembly are operably configured to comprise a start time of less than 500 milliseconds.

16. The miniature LED light bulb of claim 10 wherein the LED array and the electronics assembly are operably configured to comprise a nominal correlated color temperature of less than or equal to 4000 Kelvin.

17. The miniature LED light bulb of claim 10 wherein the LED array and the electronics assembly are operably configured to comprise a color rendering index of at least 90.

18. The miniature LED light bulb of claim 10 wherein the LED array and the electronics assembly are operably configured to comprise a rated lifetime of at least 15,000 hours.

19. The miniature LED light bulb of claim 10 wherein the LED array and the electronics assembly are operably configured to comprise an audible output of less than 24 dBA when the LED array is engaged at 100 percent and 20 percent of full light output.

20. A miniature light emitting diode (LED) light bulb comprising:
  a base portion including one or more electrical contacts arranged to mate with an electrical receptacle to receive electric current;
  an envelope portion comprising:
    a substantially cylindrical body portion coupled to the base portion;
    a heat sink coupled to an inner circumference of the body portion; and
    a substantially cylindrical light diffusing portion coupled to an upper circumference of the body portion,
  wherein the base portion and the envelope portion together are less than 100 mm in length and less than 25 mm in diameter; and
  an LED light assembly being housed in an interior portion of the envelope portion, the LED light assembly comprising:
    a flexible printed circuit board;
    a plurality of LEDs being disposed on a surface of the flexible printed circuit board, the plurality of LEDs being electrically and thermally connected to comprise an LED array; and
    an electronics assembly being disposed on the surface of the flexible printed circuit board and comprising an LED driver and an integrated circuit being operably engaged with the one or more electrical contacts and the plurality of LEDs to provide power to the LED array,
  wherein the LED array and the electronics assembly are operably configured to comprise a luminous efficiency of at least 45 lumens per watt,
  wherein the flexible printed circuit board is folded at one or more plane axis to define a radial arrangement of the plurality of LEDs.

* * * * *